US008515084B2

(12) United States Patent
Barr et al.

(10) Patent No.: US 8,515,084 B2
(45) Date of Patent: Aug. 20, 2013

(54) PASSIVE SOUND PRESSURE LEVEL LIMITER WITH BALANCING CIRCUIT

(75) Inventors: Joshua James Barr, Bangor, MI (US); Medford Alan Dyer, San Diego, CA (US); Alan Dean Michel, Fishers, IN (US); Christopher Todd Welsh, Fishers, IN (US)

(73) Assignee: Harman International Industries, Inc., Stamford, CT (US)

( * ) Notice: Subject to any disclaimer, the term of this patent is extended or adjusted under 35 U.S.C. 154(b) by 360 days.

(21) Appl. No.: 13/043,313

(22) Filed: Mar. 8, 2011

(65) Prior Publication Data
US 2011/0158414 A1 Jun. 30, 2011

Related U.S. Application Data

(63) Continuation-in-part of application No. 12/583,139, filed on Aug. 13, 2009, now Pat. No. 8,340,307.

(51) Int. Cl.
*H03G 11/00* (2006.01)

(52) U.S. Cl.
USPC .................................. 381/55; 381/56; 381/72

(58) Field of Classification Search
USPC .................. 381/55–58, 72, 74, 71.4, 17, 150, 381/117, 346, 107, 349, 337, 163; 181/129, 181/157, 163, 175, 139
See application file for complete search history.

(56) References Cited

U.S. PATENT DOCUMENTS

| | | | |
|---|---|---|---|
| 3,869,699 A | 3/1975 | Haller et al. | |
| 5,553,151 A * | 9/1996 | Goldberg | 381/312 |
| 6,408,069 B1 | 6/2002 | Furlong | |
| 7,046,813 B1 * | 5/2006 | Denda | 381/98 |
| 7,907,736 B2 * | 3/2011 | Yuen et al. | 381/1 |
| 8,218,784 B2 * | 7/2012 | Schulein et al. | 381/74 |
| 2003/0035549 A1 * | 2/2003 | Bizjak et al. | 381/56 |
| 2006/0262938 A1 | 11/2006 | Gauger et al. | |
| 2007/0230715 A1 | 10/2007 | Ingemi et al. | |
| 2008/0175397 A1 | 7/2008 | Holman | |

OTHER PUBLICATIONS

NJRC's Audio IC Line-up, featuring the NJM2761, NJR News, vol. 44, Nov. 30, 2004, p. 1 http://www.njr.com/index4.html.

* cited by examiner

*Primary Examiner* — Vivian Chin
*Assistant Examiner* — Friedrich W Fahnert
(74) *Attorney, Agent, or Firm* — Patent Law Office of David G. Beck

(57) ABSTRACT

A passive sound pressure level (SPL) limiter is provided that can be used with audio sources of varying drive levels and headphones or earphones of varying sensitivity. The SPL limiter includes a control circuit and left and right channel limiting circuits, each of which includes a pair of FETS. The SPL limiter may include a balancing circuit that separates the control signal output by the control circuit into left and right channel control signals. The SPL limiter may also include a microphone, for example integrated into an earpiece cable.

22 Claims, 10 Drawing Sheets

# PASSIVE SOUND PRESSURE LEVEL LIMITER WITH BALANCING CIRCUIT

CROSS-REFERENCE TO RELATED APPLICATION

This application is a continuation-in-part of U.S. patent application Ser. No. 12/583,139, filed 13 Aug. 2009, the disclosure of which is incorporated herein by reference for any and all purposes.

FIELD OF THE INVENTION

The present invention relates generally to audio systems and, more particularly, to means for limiting the sound pressure level in a set of headphones or earphones.

BACKGROUND OF THE INVENTION

A large percentage of the population is affected by hearing loss or impairment. For example, the National Institute on Deafness and Other Communication Disorders estimates that in the United States, 17 percent or approximately 36 million adults have some degree of hearing loss. While there is a strong correlation between age and hearing loss, a surprising study by the American Medical Association reported that approximately 15 percent of school-aged children have a hearing loss. Additionally, it has been reported that hearing problems are on the increase in all age groups.

The primary causes of hearing loss are heredity, aging, disease, trauma, ototoxic medication and long-term exposure to loud noises. Given that our day-to-day environment has become noisier in recent times, both in terms of the noise levels experienced at work and in our leisure time, undoubtedly noise induced hearing loss is the main reason that hearing problems are on the rise. Additionally, given that noise induced hearing loss is the result of both the sound pressure level (SPL) and the length of exposure, the routine and in some cases almost constant use of headphones and earbuds is certainly a contributing factor to the noted increase, especially in younger age groups.

By their very design, headphones and earbuds place the speaker transducers in close proximity to the user's eardrums. While this configuration may be convenient and, in some cases, provide an excellent listening experience, if the volume levels are set too high, their use can easily lead to hearing loss. Unfortunately, recent studies have shown that between 25 and 50 percent of headphone/earbud users routinely listen at volume levels high enough to cause hearing loss. Further exacerbating this problem is the fact that most users will turn up the volume level in an attempt to drown out background noise (e.g., commuting noise, co-workers, etc.).

In addition to educating people on the pitfalls of excessive volume levels, a number of products have recently come to market that attempt to control the SPL delivered through a headset. Setting the maximum SPL to an acceptable level is difficult, however, since different headphones/earbuds exhibit different sensitivities, and thus deliver different sound pressure levels for the same drive level.

One approach to limiting the SPL is to place a resistor between the headphone/earbud and the audio source. The resistor reduces the current to the headphone/earbud, thereby limiting the generated SPL. Unfortunately, in order to set the SPL to a specific, desired level, the maximum drive level from the audio source as well as the sensitivity of the headphone/earbud must be known. Therefore, this approach would require selecting a specific resistor for each source/earpiece combination.

Another often-used approach for liming the SPL is to limit the maximum output volume, i.e., drive voltage, from the audio source. This feature is included in many MP3 and Apple® music players. This approach will only work, however, if the sensitivity of the headphone/earbud is known in advance of setting the maximum sound level. Otherwise, changing the headphone/earbud from a low sensitivity earpiece to a high sensitivity earpiece without changing the maximum output level will allow the desired SPL to be exceeded. Conversely, changing the headphone/earbud from a high sensitivity earpiece to a low sensitivity earpiece may yield unacceptably low volume levels.

Yet another approach to limiting the SPL is to use a limiting circuit based on a combination of resistors and diodes. As this approach is typically only used when the sensitivity of the headphone/earbud is known, the limiting circuit may be permanently coupled to the earpiece, for example by molding the limiting circuit into the earpiece cabling. In addition to only working with a specific headset, most users find this approach unsatisfactory due to the very noticeable distortion at high SPL levels that result from the nonlinear characteristics of the diode.

While a number of approaches are currently being used to limit the sound pressure levels of headphones and earbuds, and thus prevent potential hearing damage, these approaches tend to have limited applicability due to their inability to take into account variations in source drive levels and earpiece sensitivities. Additionally, these approaches often create unacceptable levels of distortion, thus further reducing the number of people willing to use them. Accordingly, what is needed is a non-distorting SPL limiter design that can be applied to a wide range of source/earpiece combinations. The present invention provides such a limiter design.

SUMMARY OF THE INVENTION

The present invention provides a passive sound pressure level (SPL) limiter for use with an audio source and a pair of headphones or earphones that include left and right earpieces. The SPL limiter is comprised of a control circuit that is connected to the audio source in order to receive left and right channel audio output signals, the control circuit outputting a control signal; a balancing circuit that receives the control signal from the control circuit and outputs left and right channel control signals; and left and right channel limiting circuits, each of which includes a pair of FETs and each of which reduces the corresponding output signal from the audio source in proportion to the corresponding left and right channel control signals. The SPL limiter may include a microphone integrated into an earpiece cable, and an audio plug electrically connected to the control circuit, the left earpiece, the right earpiece and the microphone. The SPL limiter may include a microphone integrated into an earpiece cable and electrically coupled to a microphone plug, and a stereo plug electrically connected to the control circuit, the left earpiece and the right earpiece. The balancing circuit of the SPL limiter may be comprised of a potentiometer, where the balancing circuit is configured to achieve a balanced output from the left and right channel limiting circuits. The control circuit may include a transformer (e.g., with a turns ratio of between 1:10 and 1:50) and a rectifier circuit located on the secondary side of the transformer. The rectifier circuit may be a full wave rectifier comprised of four Schottky diodes. Alternately, the rectifier circuit may be comprised of a voltage multiplier. The control circuit may further comprise a filter circuit, for example a low pass filter such as an RC filter. The control circuit may further comprise one or more fast limit diode paths, each such fast limit diode paths being comprised of one or more diodes. One or more than one of the fast limit diode paths may also comprise a current limiting resistor. The passive SPL limiter may further include at least a first pad resistor interposed between the audio source and the left earpiece and at least a second pad resistor interposed between the audio source and the right earpiece. The passive SPL limiter may further include at least a first channel separation resistor and a second channel separation resistor interposed between the audio source and the control circuit. The left and right channel limiting circuits may include left and right channel dividers, respectively, each of which may be comprised of a pair of resistors. The passive SPL limiter may further comprise a frequency-weighting filter, for example interposed between the audio source and the control circuit.

In another aspect of the invention, a passive SPL limiter for use with an audio source and a pair of headphones or earphones that include left and right earpieces is provided in which the SPL limiter is comprised of a control circuit that is connected to the audio source in order to receive left and right channel audio output signals, the control circuit outputting a control signal; and left and right channel limiting circuits, each of which includes a pair of FETs and each of which reduces the corresponding output signal from the audio source in proportion to the control signal from the control circuit. In at least one embodiment, two sets of matched FETs are used, with each set of matched FETs being divided between the left and right channel limiting circuits.

A further understanding of the nature and advantages of the present invention may be realized by reference to the remaining portions of the specification and the drawings.

DESCRIPTION OF THE SPECIFIC EMBODIMENTS

In the following text, the terms "earphones", "in-ear monitors" and "earbuds" may be used interchangeably and may refer to any of a variety of different driver arrangements that are designed to fit within at least a portion of the ear (e.g., earbuds). Similarly, the terms "headphones" and "headset" may be used interchangeably and may refer to any of a variety of different speaker arrangements that are designed to fit over the ears, typically with the left and right headphones being held together via an over-the-head or behind-the-head strap or band. Similarly, the terms "audio player", "audio source" and "source" may be used interchangeably. As used herein, the term "earpiece" may refer to either the left ear or right ear of either a set of earphones or headphones. Additionally, it should be understood that the earphones and headphones described herein may be used with any of a variety of audio sources, including music players (e.g., MP3 players, Apple® iPods, CD and DVD players, stereo receivers, stereo amplifiers, etc.), telephones, computers, or other sources of audio data suitable for transmission over an earphone or headphone. It should be understood that identical element symbols used on multiple figures refer to the same component, or components of equal functionality. Additionally, the accompanying figures are only meant to illustrate, not limit, the scope of the invention and should not be considered to be to scale.

Figure 1:
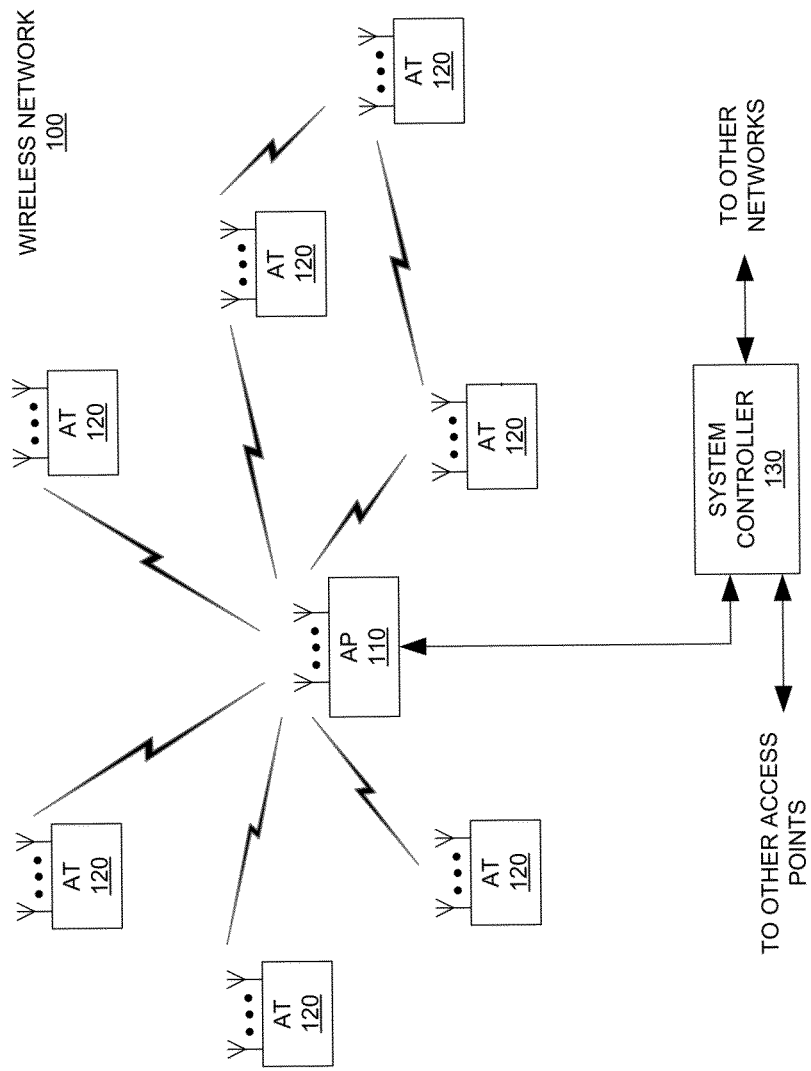
FIG. 1 provides a top-level view of an SPL limiter in accordance with the invention.

FIG. 1 illustrates the basic elements of a sound pressure level (SPL) limiter in accordance with the invention. SPL limiter 100 is passive, i.e., not powered by a battery or other external power supply. As shown, audio source 101 is coupled to a control circuit 103 that outputs a low frequency or DC control signal that represents the signal level from audio source 101. Preferably, and as described in detail below, control circuit 103 includes a transformer 105 to step-up the signal level from audio source 101. The control signal from control circuit 103 is used by limiting circuit 107 to limit the power, more specifically the voltage or current, passed through to left earpiece 109 and right earpiece 111, thereby limiting the maximum SPL of each earpiece 109/111. Limiting circuit 107 includes a balancing circuit 113 that insures that the output passed to the left and right earpieces is balanced, i.e., circuit 113 compensates for differences between the left and right channel limiting circuits, for example due to manufacturing tolerances in the FETs.

Figure 2:
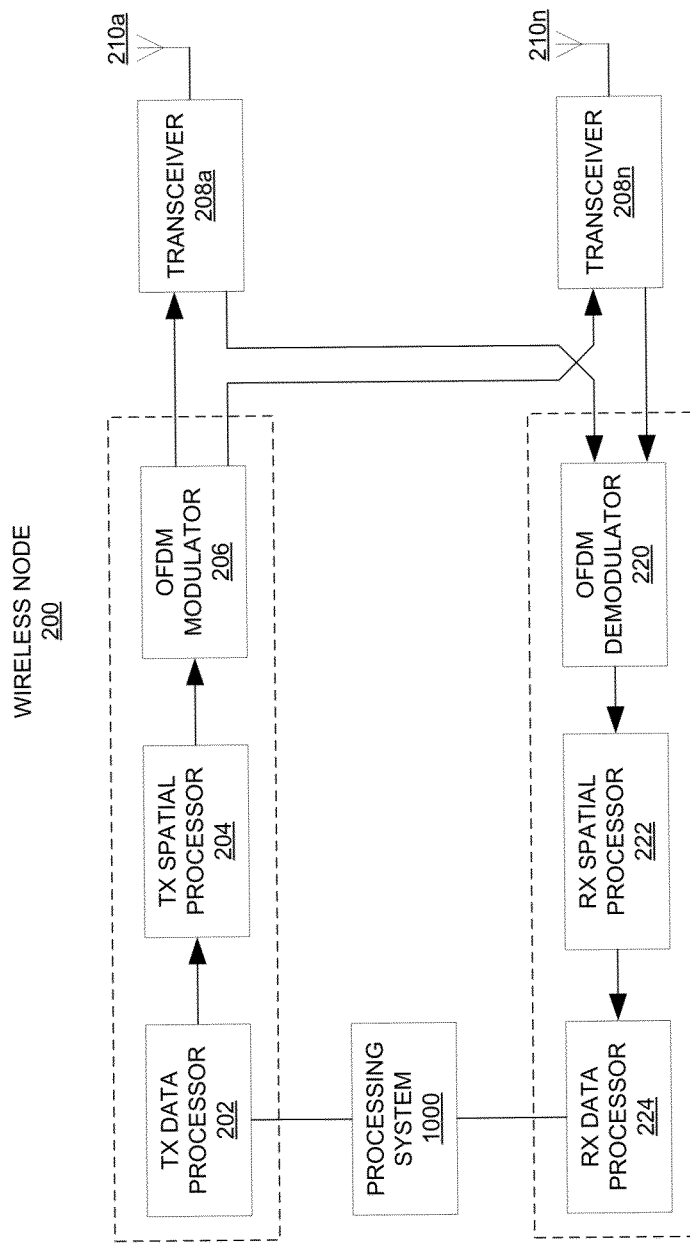
FIG. 2 provides a modification of the SPL limiter shown in FIG. 1.

FIG. 2 illustrates a variation of SPL limiter 100. As shown, SPL limiter 200 is designed for use with an audio component 201 that includes both an audio output and an audio input, a common component configuration in many devices that may include a music player of some sort, a cell phone/recording capabilities, etc. (e.g., Apple® iPhone). Other exemplary audio components that may include both an audio output and an audio input include computers, cell phones, personal digital assistants (PDAs), etc. Typically a single plug (for example, a TRS connector, i.e., tip, ring, sleeve connector) is used to couple system 200 to audio component 201, although other configurations may be used (e.g., two plugs comprised of a stereo plug for coupling to a stereo output jack and a microphone plug for coupling to a microphone jack; three plugs comprised of a first plug for coupling to a left channel output jack, a second plug for coupling to a right channel output jack and a microphone plug for coupling to a microphone jack). In a preferred embodiment, the cable for the headphones/earphones and the cable for the microphone are combined, for example by integrating the microphone into one of the earpiece cables.

Figure 3:
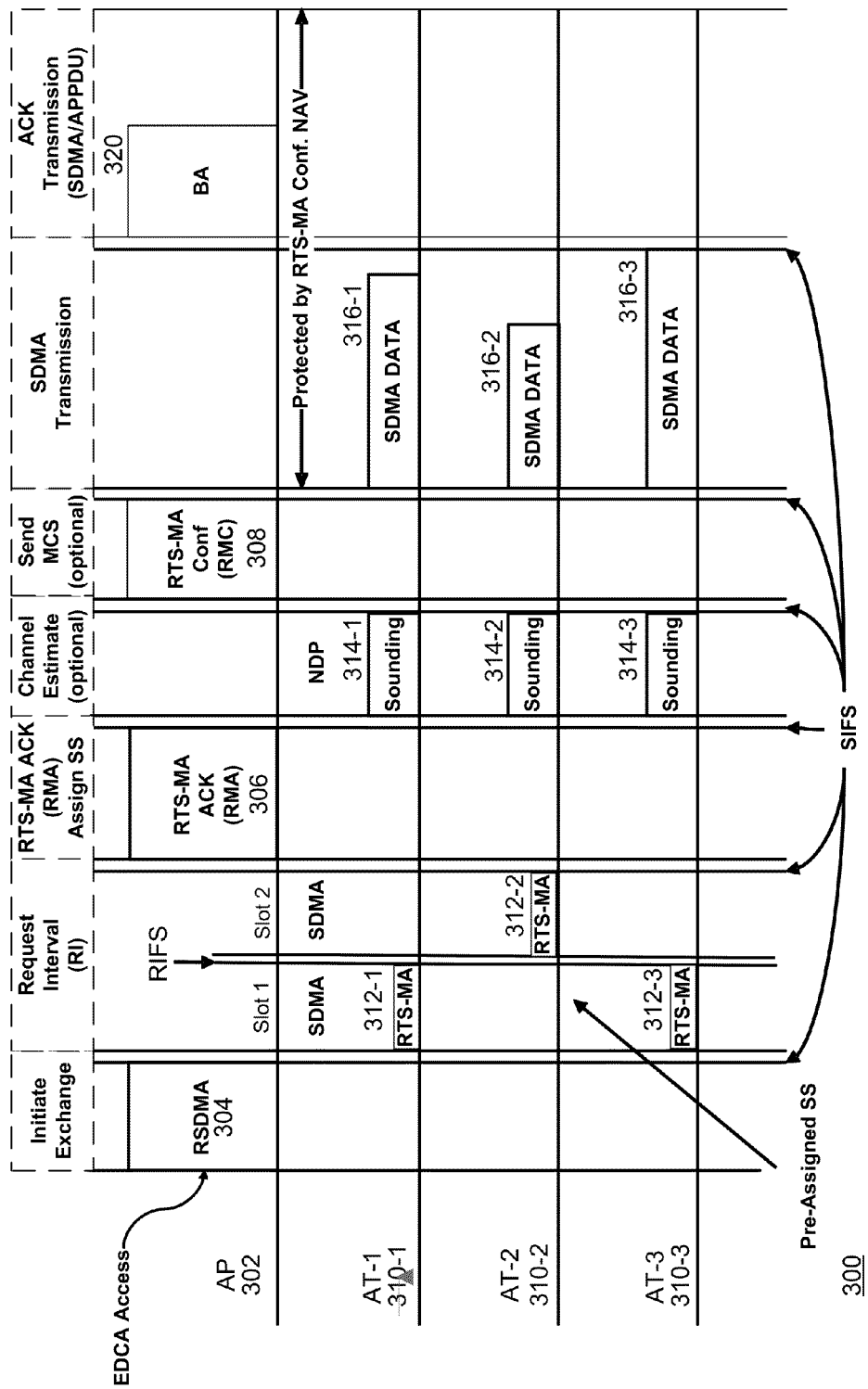
FIG. 3 provides a detailed diagram of a preferred embodiment.

FIG. 3 provides a detailed diagram of a preferred embodiment of the invention. It should be understood that the present invention may be implemented in a stand-alone device (e.g., separate from the audio source and earphones/headphones, but intended for use with an audio source and set of earphones/headphones), implemented within an audio source, or implemented within a set of headphones, earphones, or corresponding cable. As shown, SPL limiter 300 is connected to a multi-channel, e.g., stereo, audio source 301. Both channels of audio source 301 are coupled to a control circuit 303, thus averaging the audio source output from both channels. The output from control circuit 303 controls both the left and right channel limiting circuits 305 and 307, respectively, after passing through balancing circuit 309.

Each limiting circuit 305/307 is comprised of means to reduce the power delivered to respective earpieces 311/313 in proportion to the control signal output by control circuit 303. Preferably, and as illustrated, each limiting circuit 305/307 includes a pair of enhancement-mode, n-channel MOSFET devices 315. By using a pair of transistors, rather than a single transistor, each limiting circuit is provided with sufficient current limiting capabilities to handle a typical system. The control voltage on left channel signal path 317, and the control voltage on right channel signal path 319, control the amount of resistance in the channel of MOSFET devices 315. More specifically, as the control voltage on signal path 317/319 increases, the gate voltage of the corresponding pair of MOSFETs increases and the resistance of the channel decreases. As the channel resistance decreases, more current flows through MOSFET devices 315, thereby causing a voltage drop across corresponding pad resistors 321/323 to increase. As a result, the voltage to earpieces 311/313 decreases, causing a corresponding decrease in the SPL generated by earpieces 311/313.

The control voltage on signal paths 317/319 is generated by control circuit 303. Control circuit 303 is preferably comprised of a transformer, a diode rectifier and an RC filter. The function of transformer 325 is to step up, i.e., increase, the voltage generated by audio source 301. A typical turns ratio for transformer 325 is between 1:10 and 1:50, resulting in the voltage created on the secondary side of the transformer being between 10 and 50 times greater than the voltage on the primary, i.e., input, side. On the secondary side of transformer 325 is a voltage rectifier 327. In the preferred embodiment, rectifier 327 is a full wave rectifier implemented with four Schottky barrier diodes 329-332. Schottky diodes are preferred in this application in order to minimize the power loss, i.e., as compared to ordinary PN junction diodes. The low forward voltage drop of the Schottky diodes allows rectification to start at a lower voltage on the secondary. After the signal is rectified, it passes to RC filter 333, which is comprised of resistor 335 and capacitor 337. In this embodiment, resistor 335 has a value of 200 kohms and capacitor 337 has a value of 10 μf. RC filter 333 is a first order, low pass filter with a time constant preferably between 0.1 and 2 seconds. The output of RC filter 333 is the control voltage on signal path 339.

Signal path 339 is coupled to balancing circuit 309. Balancing circuit 309 allows the control voltage on signal path 339 to be unequally distributed to the MOSFET devices 315 on the left and right channels, i.e., inputs 317 and 319, thereby allowing MOSFET device variations between left channel limiting circuit 305 and right channel limiting circuit 307 to be taken into account. In a preferred embodiment, and as illustrated, balancing circuit 309 is comprised of a potentiometer. By utilizing a test input signal with equal (or known) left and right channel signals, the output from the SPL limiter may be balanced utilizing potentiometer 341. It will be appreciated that while potentiometer 341 is preferred, it may be replaced with a pair of resistors, one interposed between signal paths 339 and 317, and the other interposed between signal paths 339 and 319.

In SPL limiter 300, the output from audio source 301, per channel, is not directly coupled to earpieces 311/313. A pair of pad resistors 343 and 345 is interposed between the output, per channel, of audio source 301 and the respective earpieces 311/313. The purpose of the pad resistors is to resist current flow between audio source 301 and earpieces 311/313, thereby reducing the SPL generated by each earpiece. A second function of the pad resistors is to provide a minimum resistance for audio source 301 to drive when the resistance of the FET channel in transistors 315 approach zero. If the pad resistors were not in place, MOSFET devices 315 could effectively short audio source 301 to ground, creating a potentially large current flow that could damage both audio source 301 and MOSFET devices 315. Pad resistors 343 and 345 limit this current flow.

The ratio of resistor 343 to resistor 345 affects the performance of control circuit 303. When the value of resistor 343 is very low or zero, control circuit 303 is effectively driven by audio source 301. In this scenario, as the voltage generated by audio source 301 increases, the impedance of the FET channel in MOSFET devices 315 will decrease. Depending on the characteristics of MOSFET devices 315, this can lead to a situation where the SPL at earpieces 311/313 decreases as the output voltage of audio source 301 is increased.

In the illustrated embodiment, preferably resistors 343 each have a value of 27 ohms and resistors 345 each have a value of 0 ohms if the SPL limiter is used with headphones, and preferably resistors 343 each have a value of 20 ohms and resistors 345 each have a value of 0 ohms if the SPL limiter is used with earphones. The difference in the value for resistors 343 is due to the sensitivity differences between headphones and earphones, the higher sensitivity of the earphones requiring less voltage for a given SPL. In some embodiments, the value for resistors 345 may be increased from a 0 ohm value in order to alter the rate of increase of the SPL at earpieces 311/313 as the output from audio source 301 is increased.

In addition to resistors 343, control circuit 303 is separated from the output from audio source 301 by resistors 347, referred to herein as channel separation resistors. Resistors 347 insure channel separation while maintaining audio quality. Preferably resistors 347 each have a value of 10 ohms.

In order to further reduce and/or eliminate distortion, preferably each channel includes a divider comprised of resistors 349 and 351. The divider reduces the nonlinear characteristics of the FET channel at the high voltages found in headphones. Without the use of a divider, transistors 315 will turn on at lower audio source drive levels. Accordingly, the use of a divider is less important when SPL limiter 300 is used with a set of high efficiency earphones, thus allowing the divider to be eliminated in such situations if desired. In at least one preferred embodiment, resistors 349 are eliminated, or their value is set at 0 ohms, thus directly connecting the output from balancing circuit 309 to the gates of transistors 315. Even if resistors 349 are eliminated, preferably feedback resistors 351 are still included in the circuit.

It will be appreciated that the disclosed circuit may be implemented in a variety of ways without departing from the invention. For example, in at least one preferred embodiment, the pair of FET devices 315 used for each channel's limiting circuit, i.e., circuits 305 and 307, are adjacent FET die taken from the same manufacturing wafer, thereby simplifying fabrication. Additionally, adjacent die typically exhibit similar characteristics (e.g., threshold voltages). Another circuit configuration that helps to reduce device cost while improving manufacturability is to replace balancing potentiometer 341 with multiple resistors that are easily selectable during device fabrication. For example, three resistors can be interposed between control signal line 339 and limiting circuit line 317, and three resistors can be interposed between control signal line 339 and limiting circuit line 319. The selection of a particular resistor for each channel can be made, for example, using selectable solder shorts.

Figure 4:
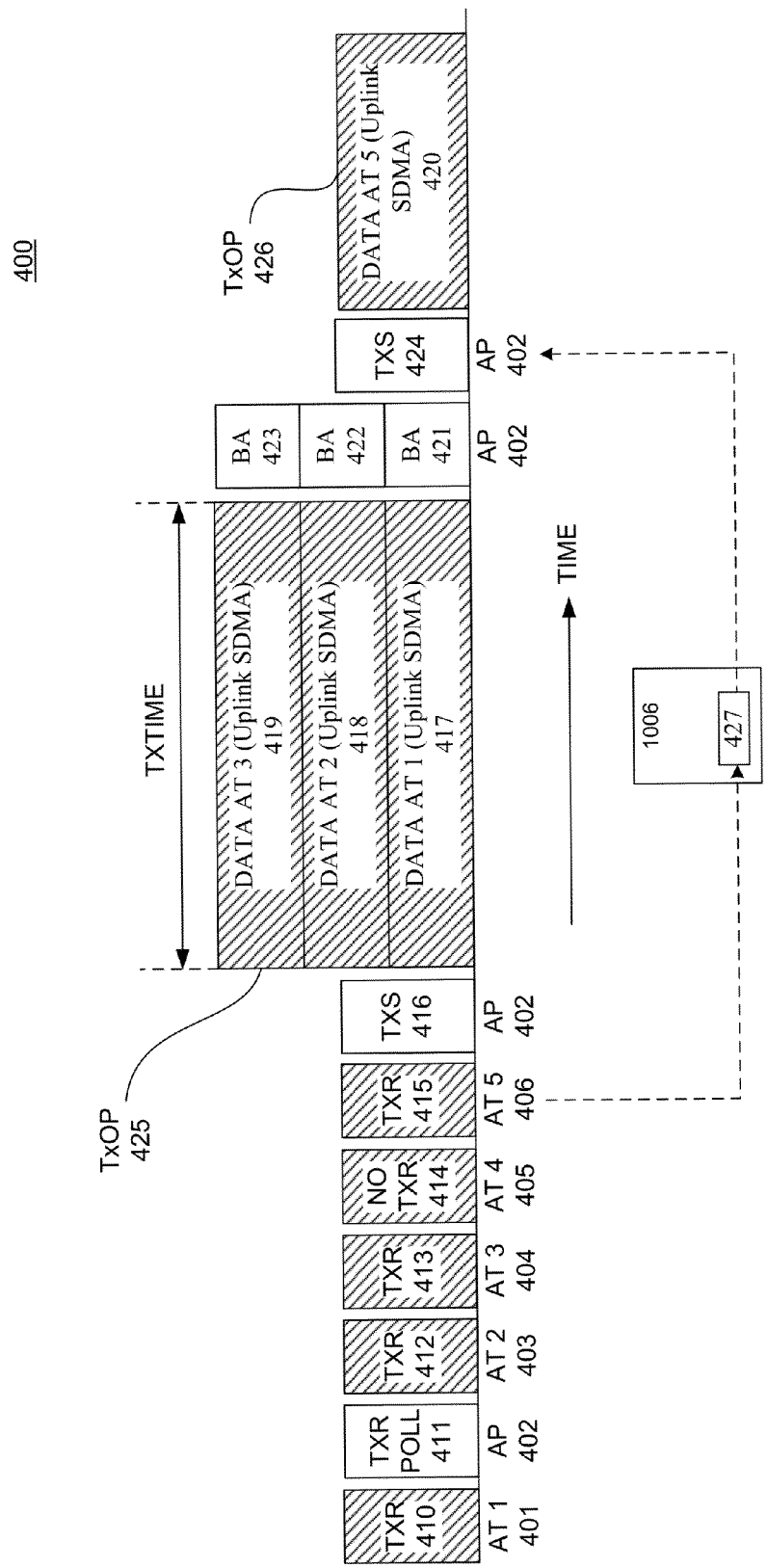
FIG. 4 illustrates a modification of the circuit shown in FIG. 3, the modified circuit including a series of fast limiting diodes.

The circuit shown in FIG. 3 achieves low distortion by not clipping large, short duration audio signals from source 301. FIG. 4 illustrates a modified circuit suitable for applications where it is desirable to have the limiting circuit respond faster to high level spikes in the audio signal. In particular, circuit 400 modifies the previous circuit by adding diodes in parallel to low pass filter resistor 335. In the illustrated circuit, a series of fast limit diodes 401, specifically diodes 403-405, will quickly suppress a loud spike in the audio signal. It should be understood that although the illustrated circuit shows three diodes 403-405, the circuit may use more or less diodes in this series, depending upon the level of input spike that is to be suppressed. The more diodes in this series, the larger the cumulative forward voltage drop must be before any current can flow through them to charge capacitor 337. Conversely, if three diodes, as shown, are limiting at too high a voltage level, then two diodes or even a single diode may be used. Additionally, a resistor may be added to the circuit (not shown), following the fast limiting diodes, thereby limiting the rate at which the spike is allowed to charge capacitor 337 and thus increase the control voltage.

Figure 5:
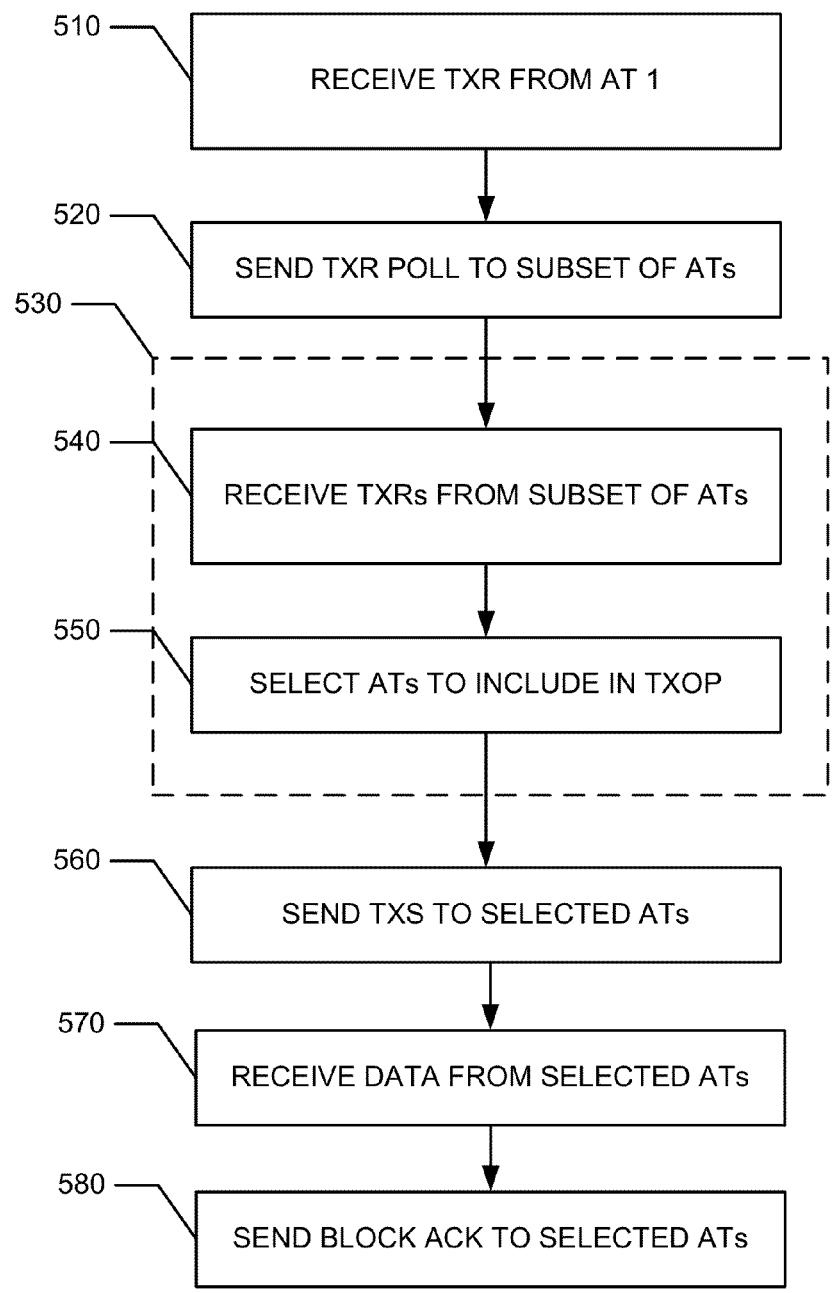
FIG. 5 illustrates a modification of the circuit shown in FIG. 3, the modified circuit including multiple series of fast limiting diodes to control different spike levels.

In a modification of the circuit shown above, multiple parallel paths of diodes and resistors can be implemented to allow different charge rates depending on the level of the spike in the audio signal. In the modified circuit shown in FIG. 5, only the highest level signals can pass current through path 501. This is because the signal must be larger than the combined forward drops of diodes 503-506 plus the control voltage. There is no current limiting resistor in this path so the limit is basically the output impedance of the secondary of transformer 325. As a consequence, when current flows through path 501, capacitor 337 is immediately charged. Smaller audio signal spikes can pass through path 507. This path is limited by resistor 509, with a nominal resistance of 50 kohms, and will charge capacitor 337 four times as fast as resistor 335, which has a nominal resistance of 200 kohms.

Figure 6:
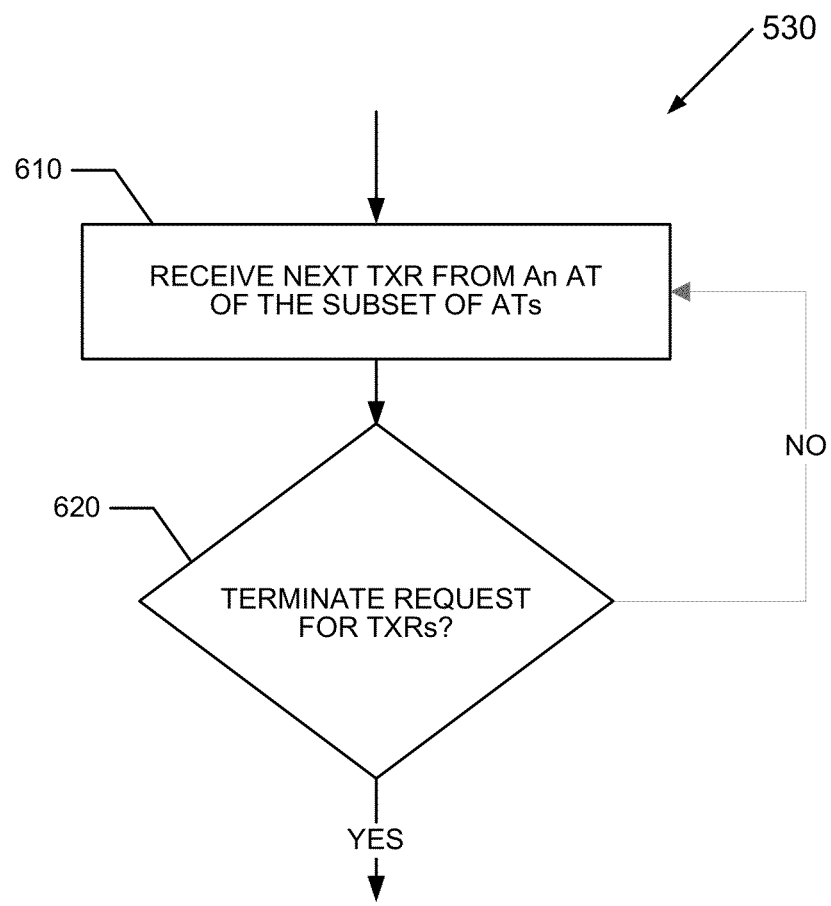
FIG. 6 illustrates an alternate embodiment utilizing a voltage multiplier.

FIG. 6 illustrates an alternate embodiment of the invention. In this embodiment, a voltage multiplier 601, acting as a rectifier, follows transformer 325. Voltage multiplier 601 is designed to convert the AC signal to a high magnitude DC signal through the use of diodes and capacitors. In the preferred embodiment, the capacitors in voltage multiplier 601 each have a value of 2200 pf. A benefit of this approach is that it allows a lower turn ratio transformer to be used while achieving the same control voltage.

Figure 7:
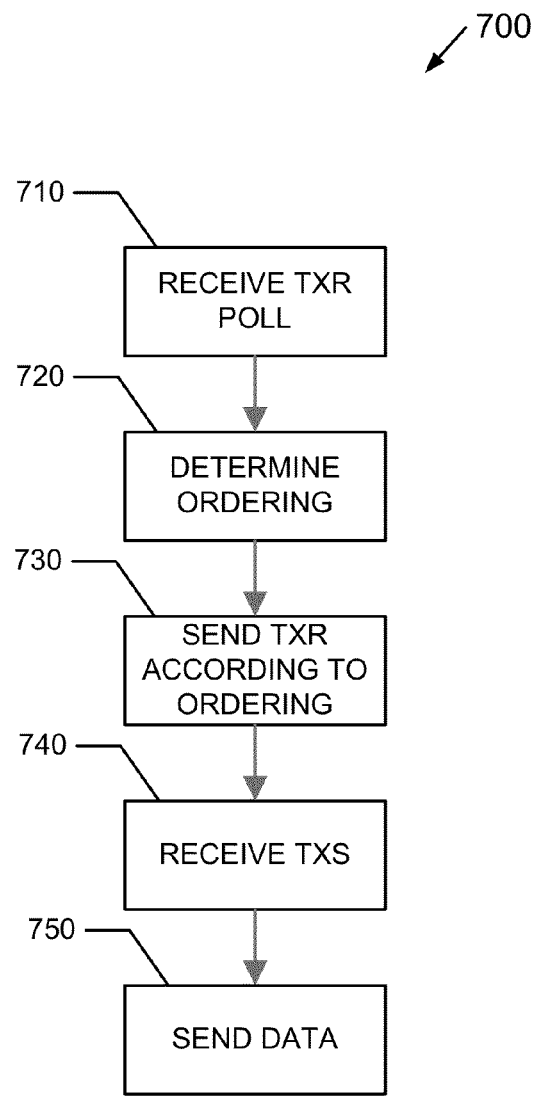
FIG. 7 illustrates an alternate embodiment suitable for use with low sensitivity earpieces.

The embodiments described above may be used with either low or high sensitivity earpieces. If, however, the limiter of the invention is to be used with a low sensitivity earpiece, then for some high output audio sources the step-up transformer can be eliminated. FIG. 7 illustrates one such embodiment. In this embodiment, transformer 325 and voltage rectifier 327 are replaced by Schottky diode 701. Pad resistors 343 and 345 can be adjusted from 0 to a large value, depending upon the type of performance desired from limiter 700. In a minor variation of this embodiment, a voltage multiplier is used in place of diode 701.

The operation of limiter 700 is similar to the previously described, current shunting circuits. Specifically, diode 701 rectifies the positive voltage output by audio source 301. Pad resistors 343/345 limit the amount of current pulled from audio source 301. The voltage on capacitor 337 controls the amount of current that is shunted through limiting circuits 305 and 307. As in the previous embodiments, circuit 700 includes a feedback network to increase linear behavior, i.e., linearizing the current and voltage characteristics of the FETs' drain to source channel for a given gate voltage.

Even though limiter 700 does not use a transformer, this circuit still achieves lower distortion than a conventional limiter by using a transistor, rather than a diode, as the limiting device. Additionally, circuit 700 uses a DC voltage to control the amount of limiting performed by the circuit.

Figure 8:
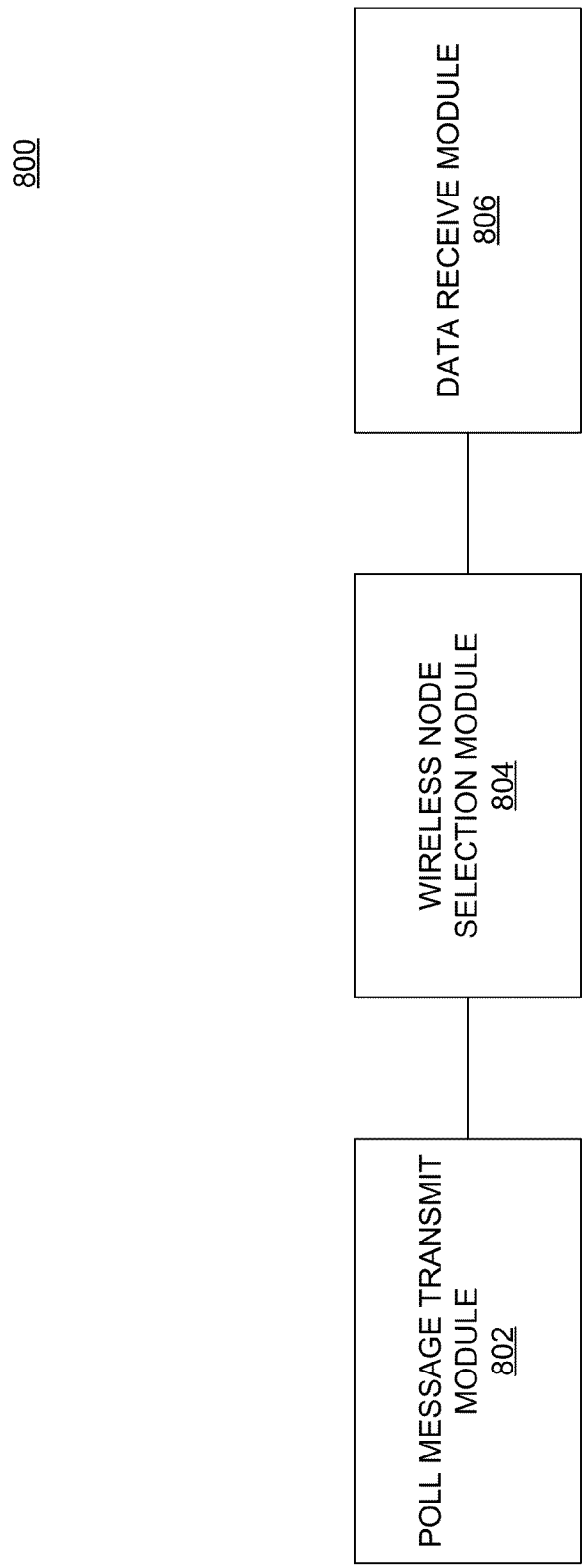
FIG. 8 illustrates a modification of the circuit shown in FIG. 3, the modified circuit including a weighting filter.

Although the principal components of a limiter in accordance with the invention have been described above, it will be appreciated that the inventors envision minor circuit variations to tailor its performance further. For example, a frequency-weighting filter may be placed in any of the previously described circuits, either between the audio source and the transformer or after the transformer. FIG. 8 shows one such embodiment, based on the configuration shown in FIG. 3, in which a frequency-weighting filter 801 is positioned before transformer 325. As it is well known that the human hearing system is more sensitive to some frequencies than others, preferably weighting filter 801 is used to take into account perceived SPL rather than actual SPL. Filter 801 may be, for example, A-, B-, C-, D- or Z-weighted. By including frequency-weighting filter 801, the output of the limiter will be based on the weighting filter, e.g., perceived loudness, rather than the actual signal voltage.

Figure 9:
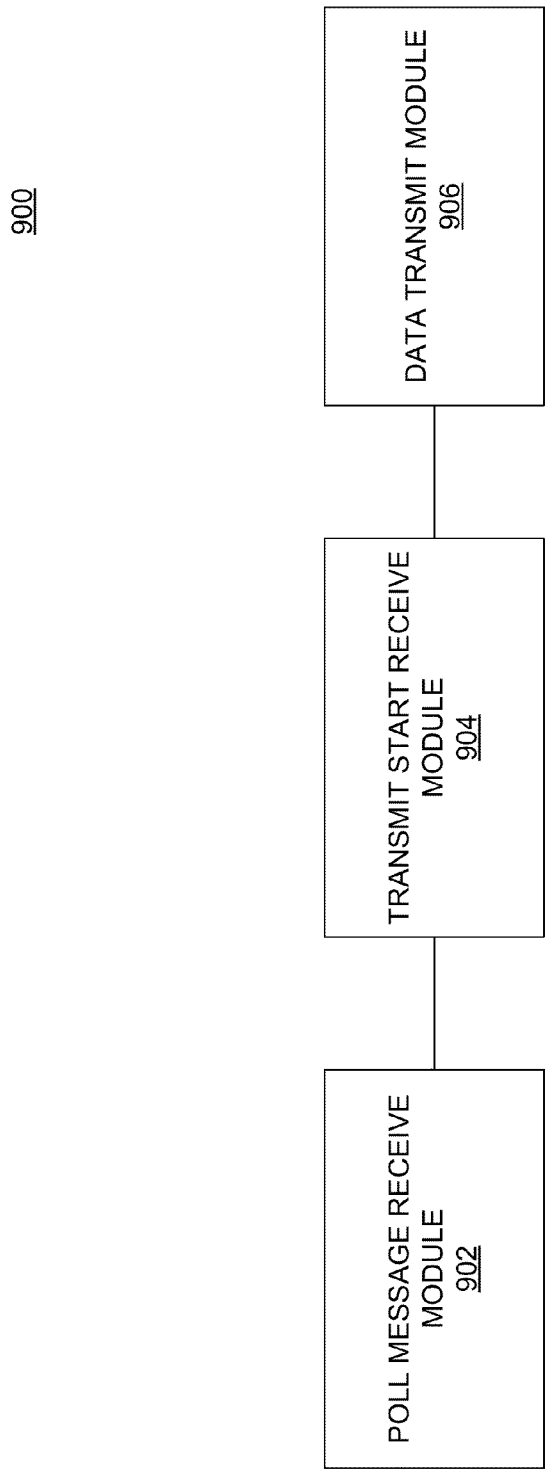
FIG. 9 illustrates a modification of the circuit shown in FIG. 3, the modified circuit matched sets of FETs.

Regardless of the technique used to provide a control signal on signal line 339, the ability of limiting circuits 305 and 307 to be relatively free of distortion depends on achieving an essentially linear current to voltage relationship on FETs 315. For small Vds voltages (i.e., the voltage between the FET source and drain), FETs exhibit relatively linear characteristics. As the Vds increases, the current to voltage relationship becomes non-linear, and therefore in the circuits illustrated in FIGS. 3-8 each channel includes a divider comprised of resistors 349 and 351. However, as previously noted, the use of a divider becomes less important when the SPL limiter of the invention is used with a set of high sensitivity earpieces (e.g., high sensitivity in-ear monitors). In such a situation, not only can resistors 349 be eliminated as previously noted, but in some instances resistors 351 may also be eliminated as illustrated in FIG. 9.

In circuit 900, both the balancing circuit and the dividers are eliminated, balancing between limiting circuits 305 and 307 being achieved via the selection of the individual FETs. As noted above, adjacent die taken from the same wafer will typically exhibit very similar device characteristics, thus performing as a set of matched FETs. Therefore in circuit 900 two sets of matched FETs are used, each matched set being split between the left and right channel limiting circuits 305 and 307, respectively. In other words, FETs 901 and 902 are taken from one matched set, and FETs 903 and 904 from a second matched set. It will be appreciated that this approach may be used with any of the circuits shown in FIGS. 3-8.

Figure 10:
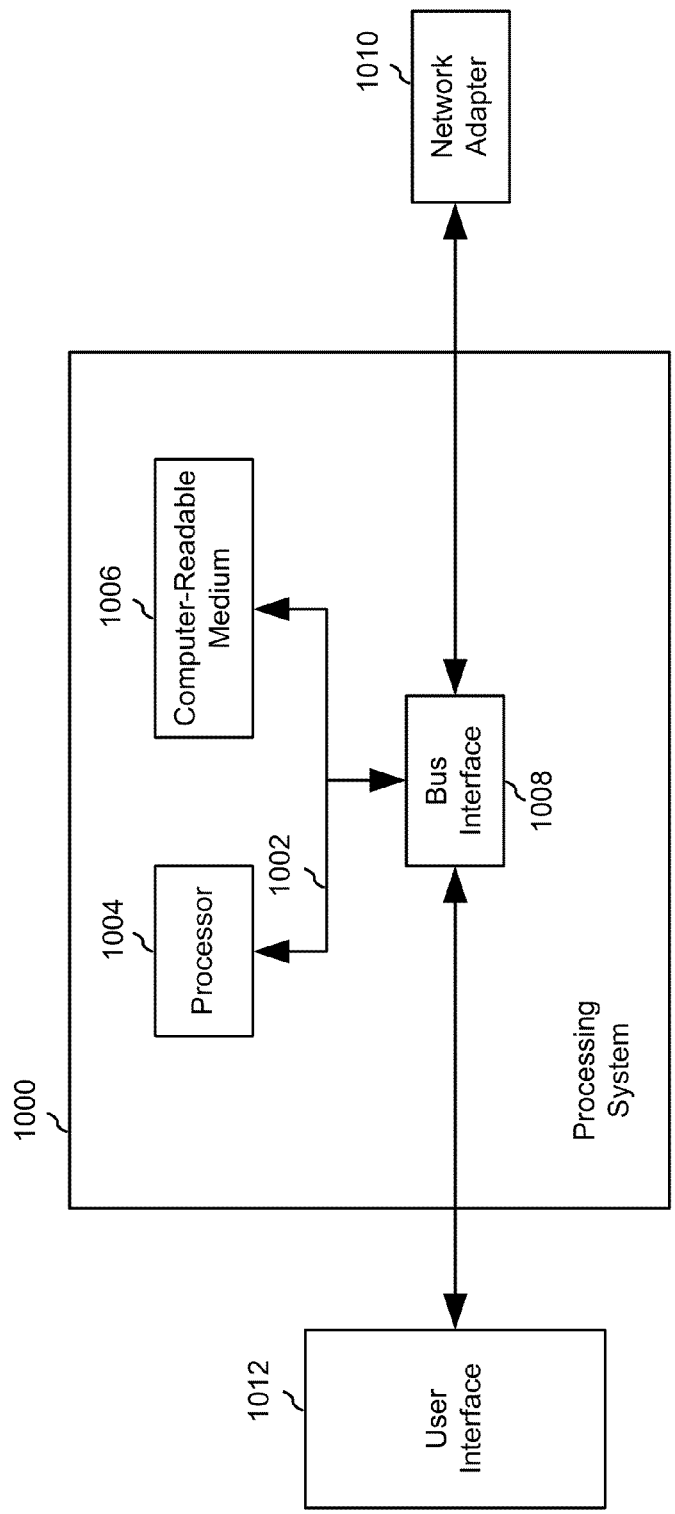
FIG. 10 illustrates a modification of the circuit shown in FIG. 3, the modified circuit eliminating the dividers and increasing the resistance corresponding to the balancing circuit.
Figure 1:
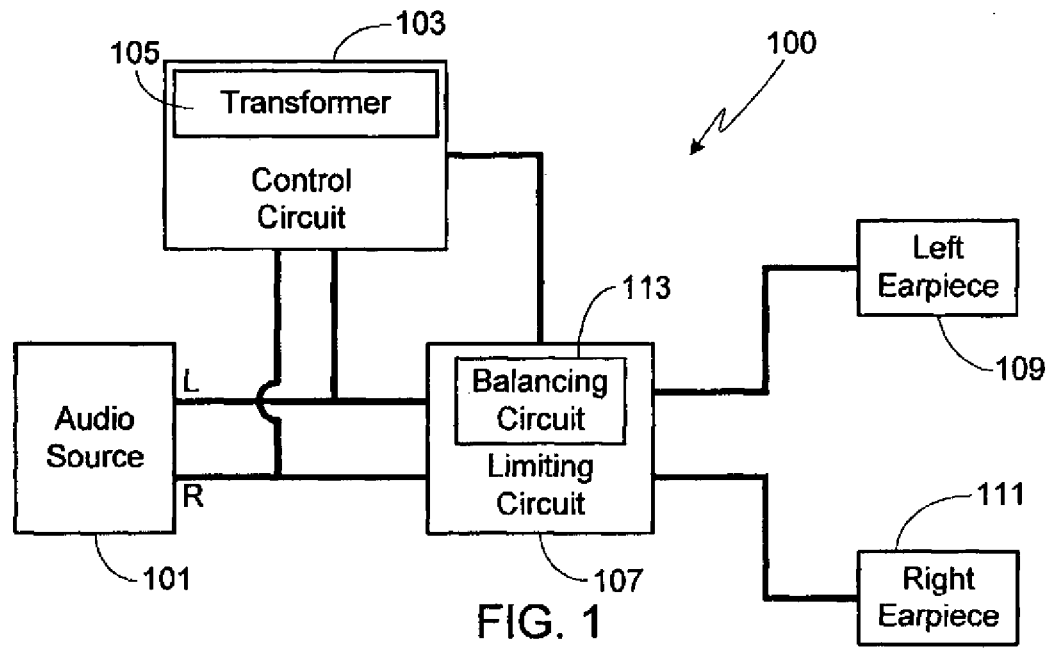
Figure 2:
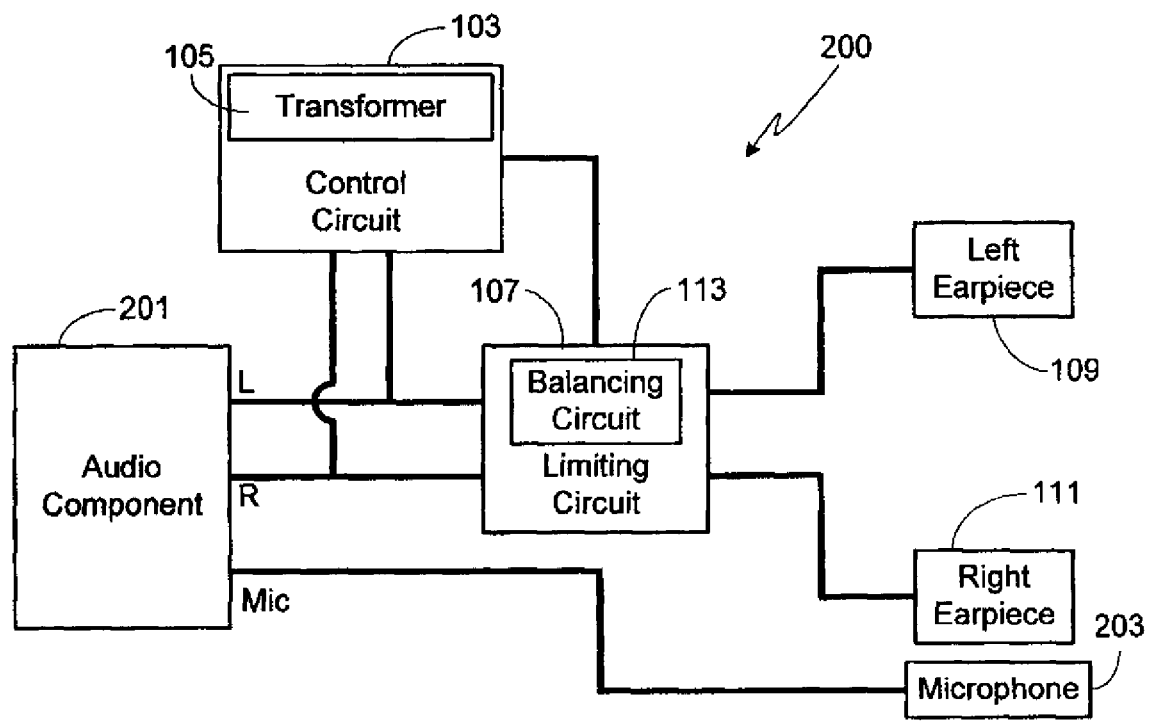
Figure 3:
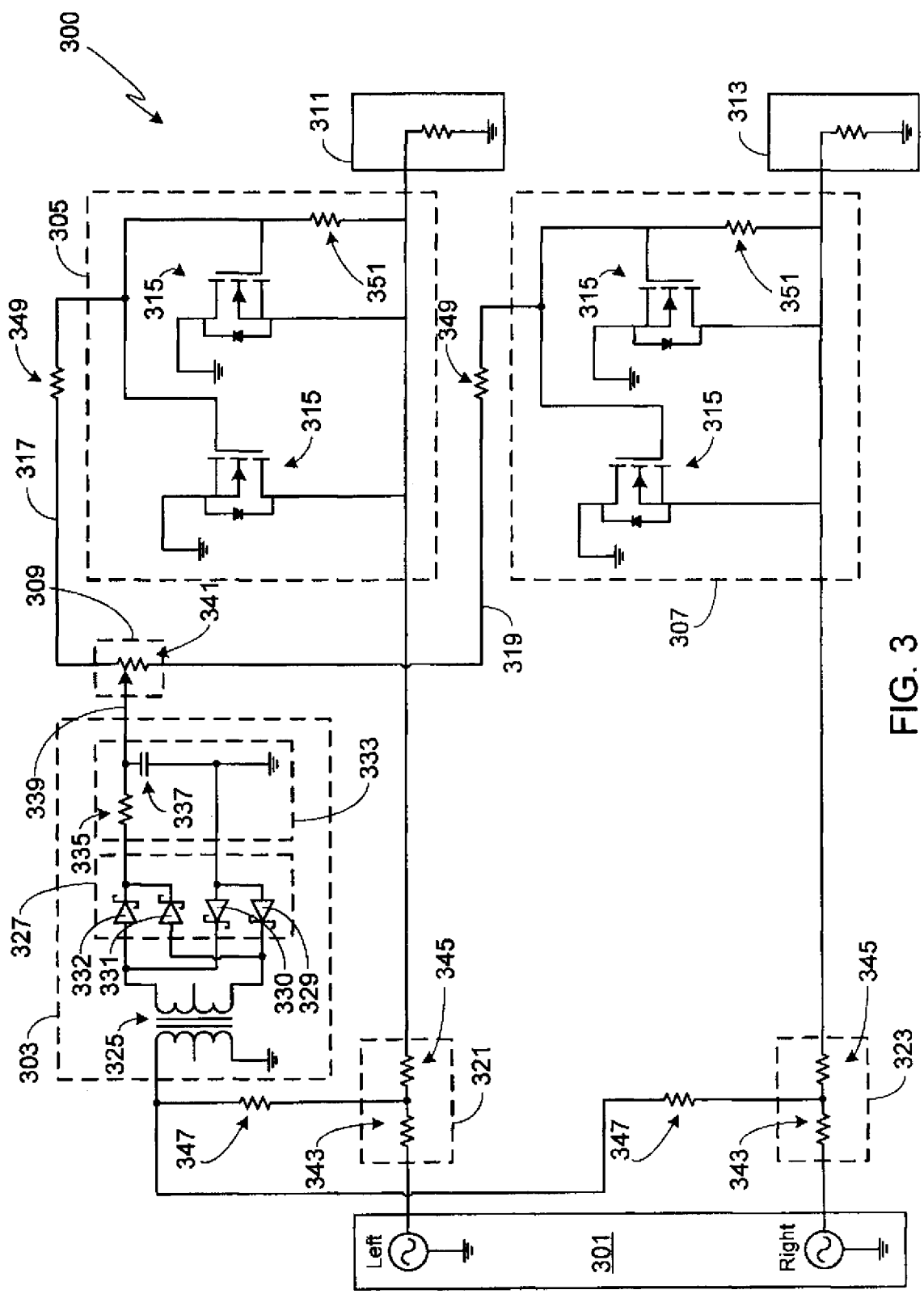
Figure 4:
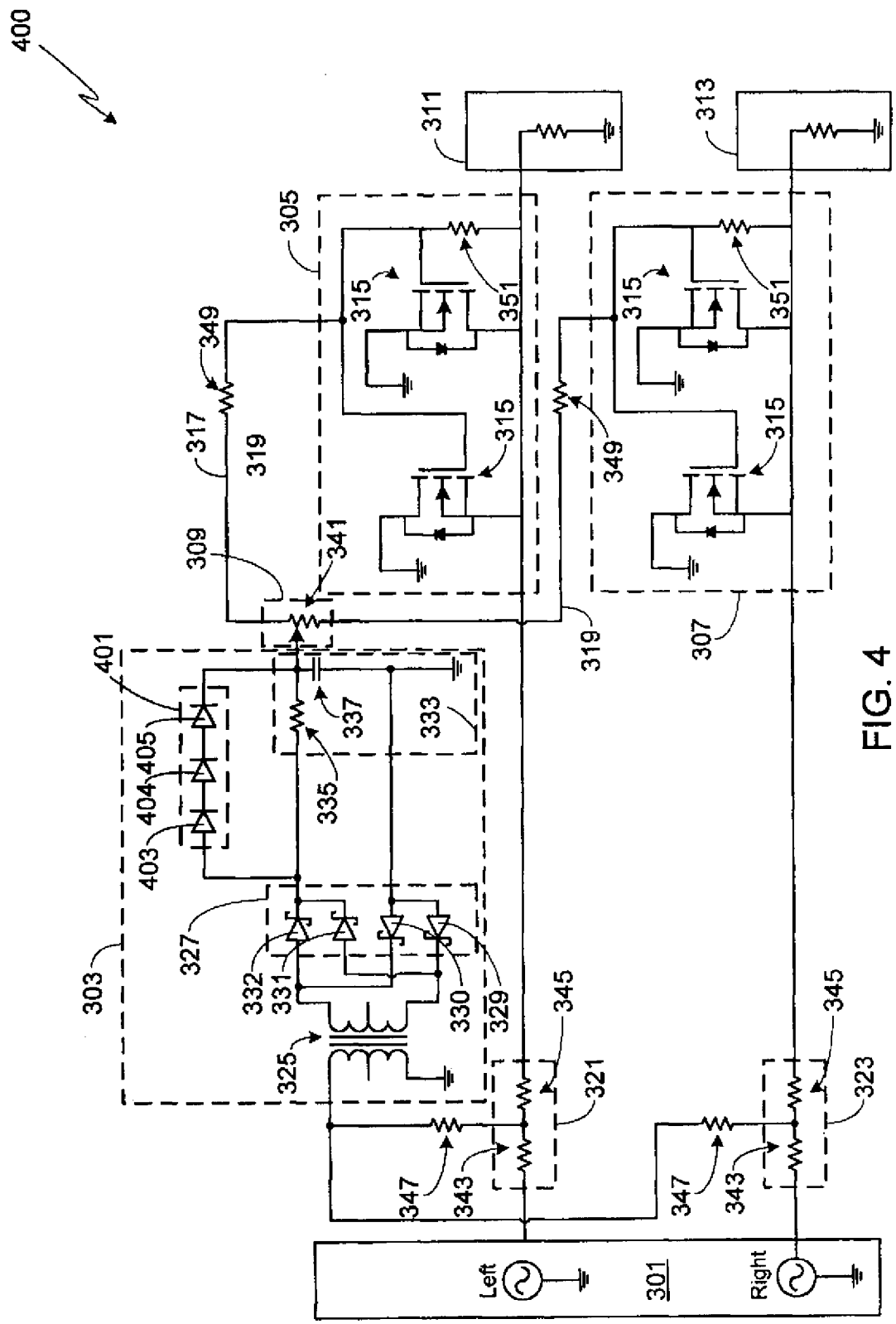
Figure 5:
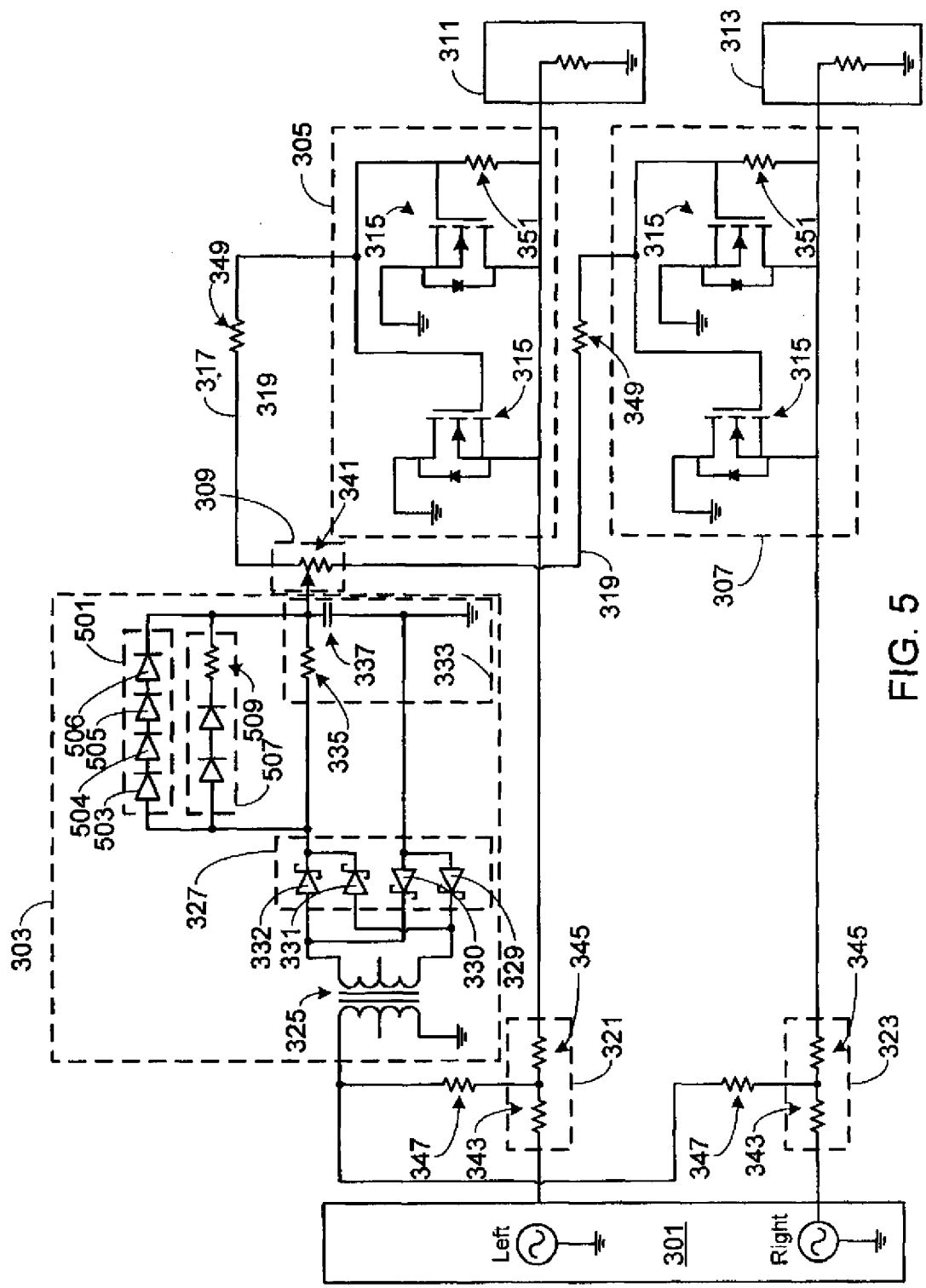
Figure 6:
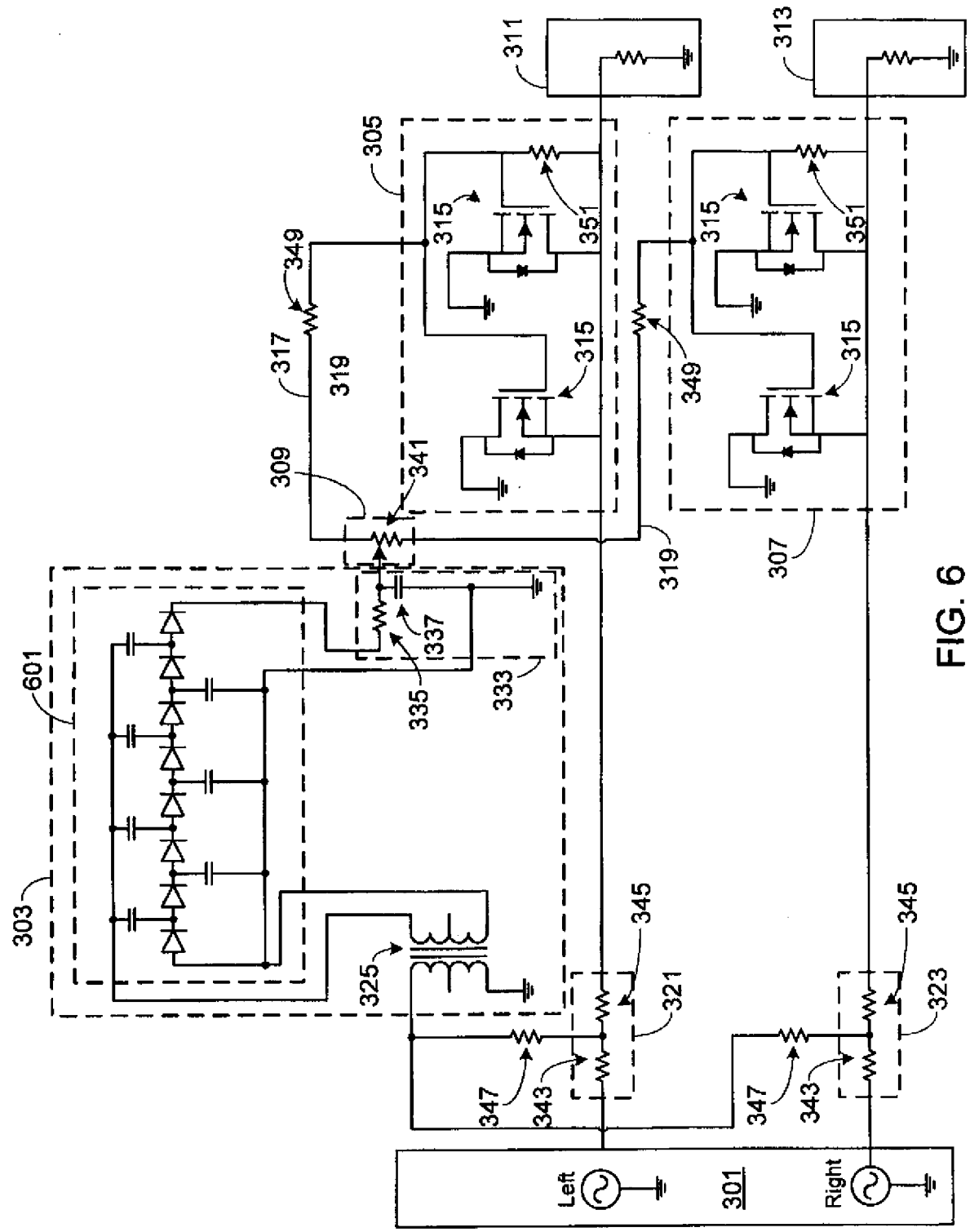
Figure 7:
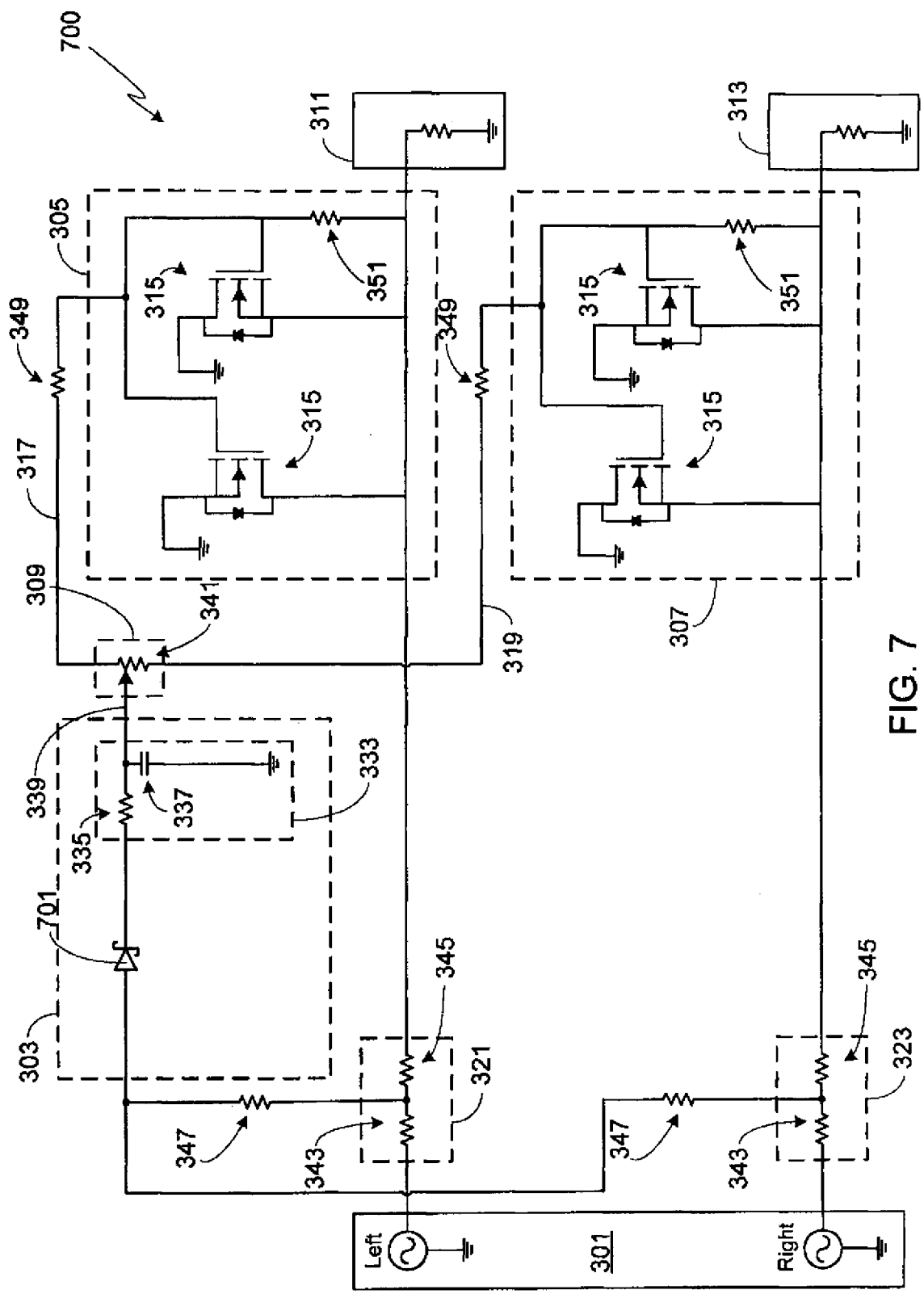
Figure 8:
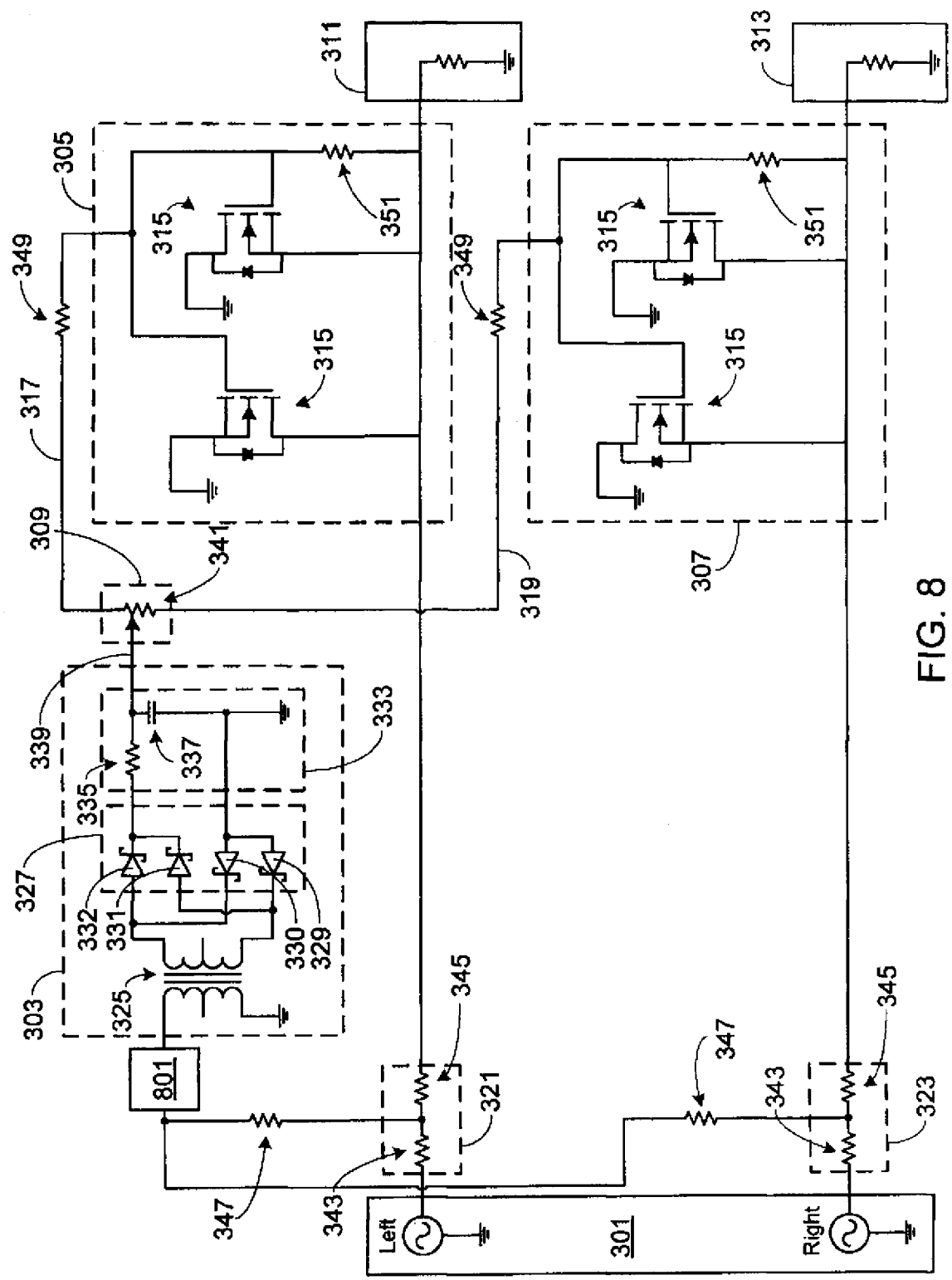
Figure 9:
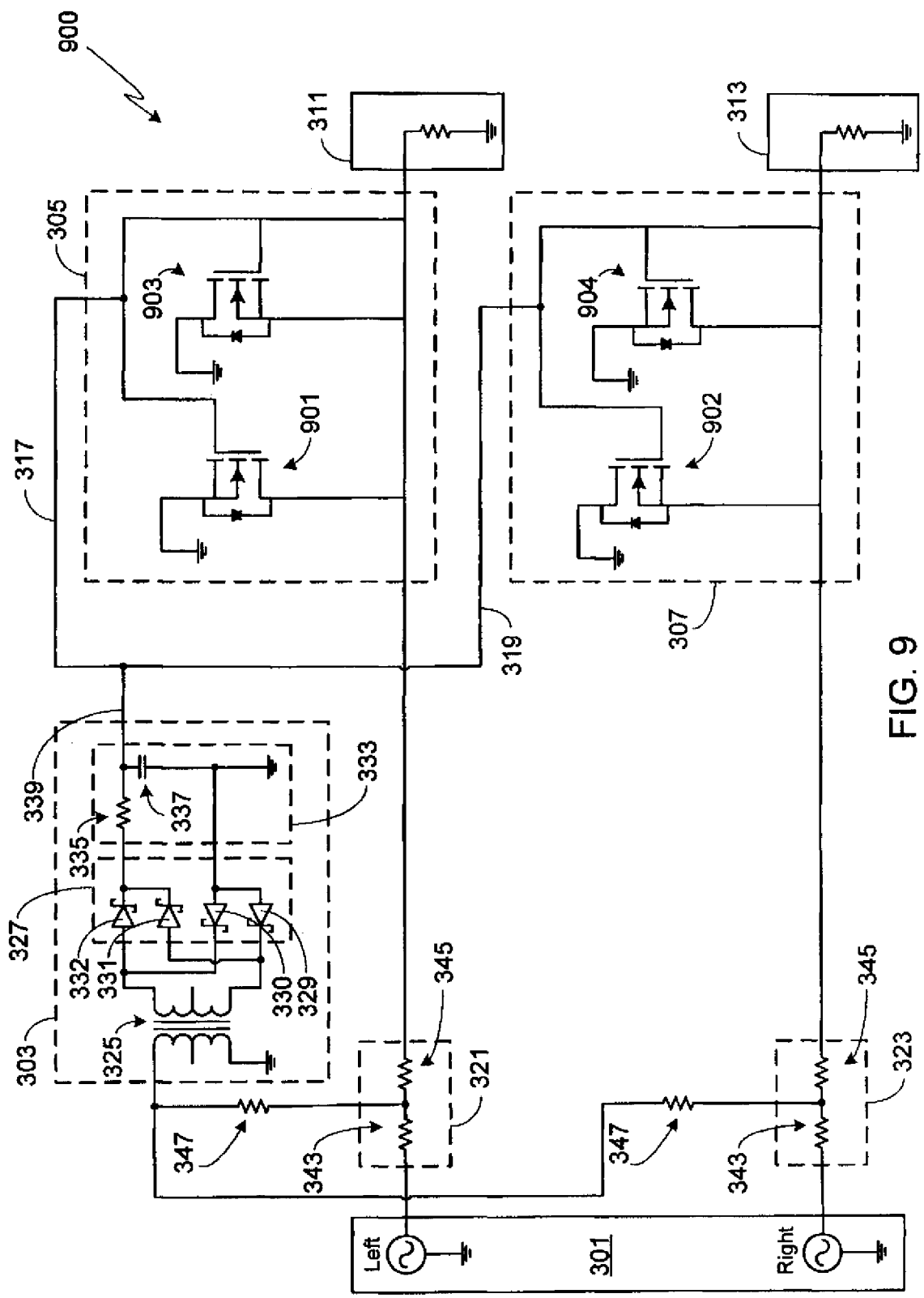
Figure 10:
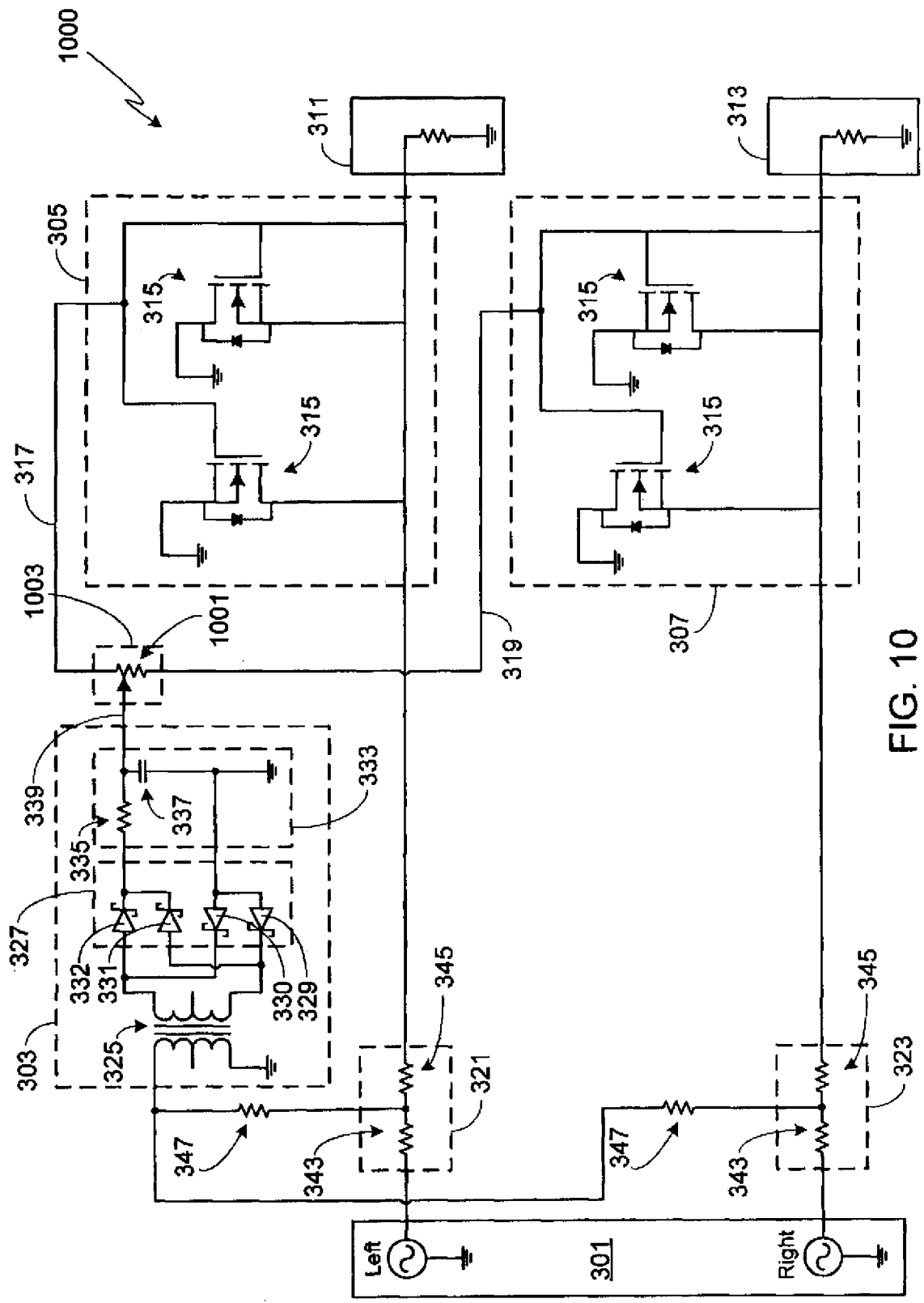
Figure 1:
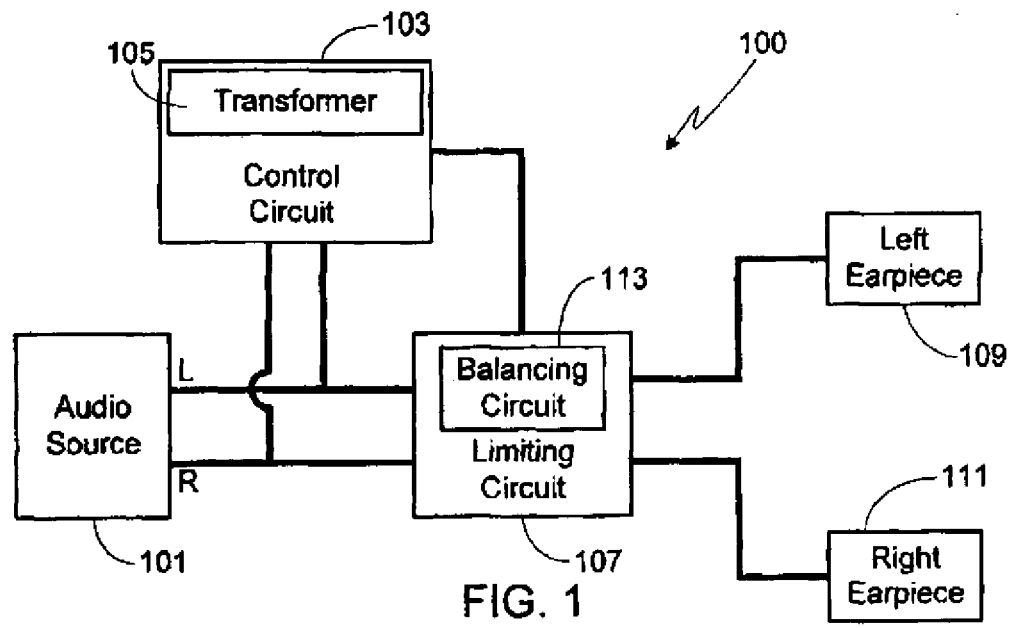
Figure 2:
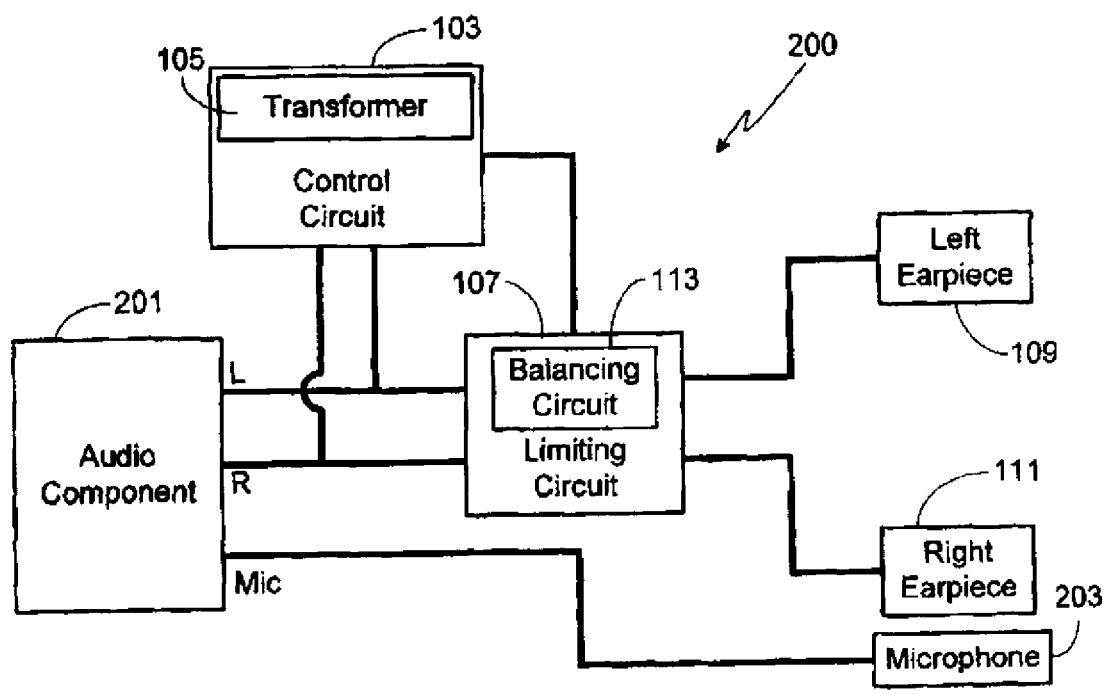
Figure 3:
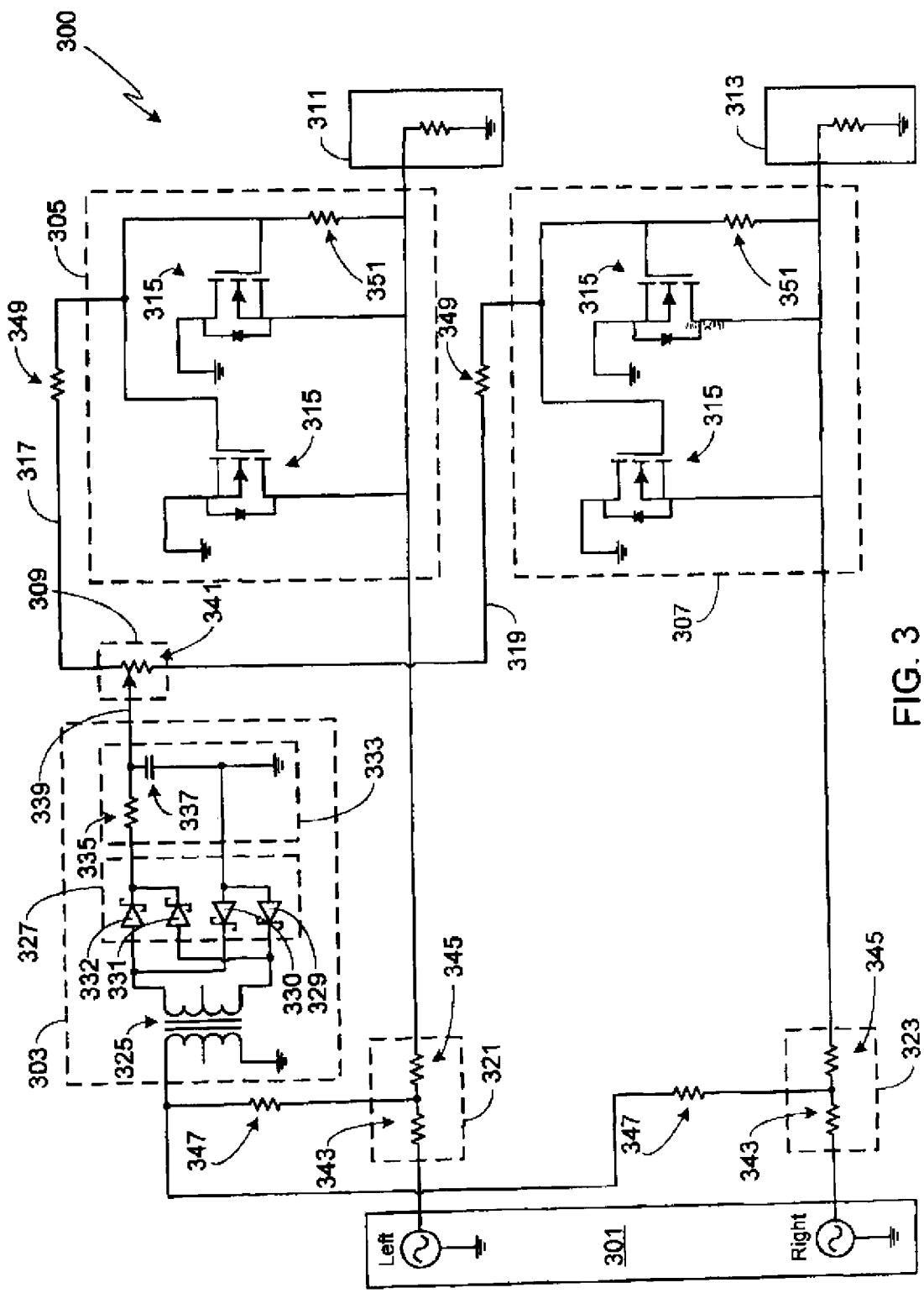
Figure 4:
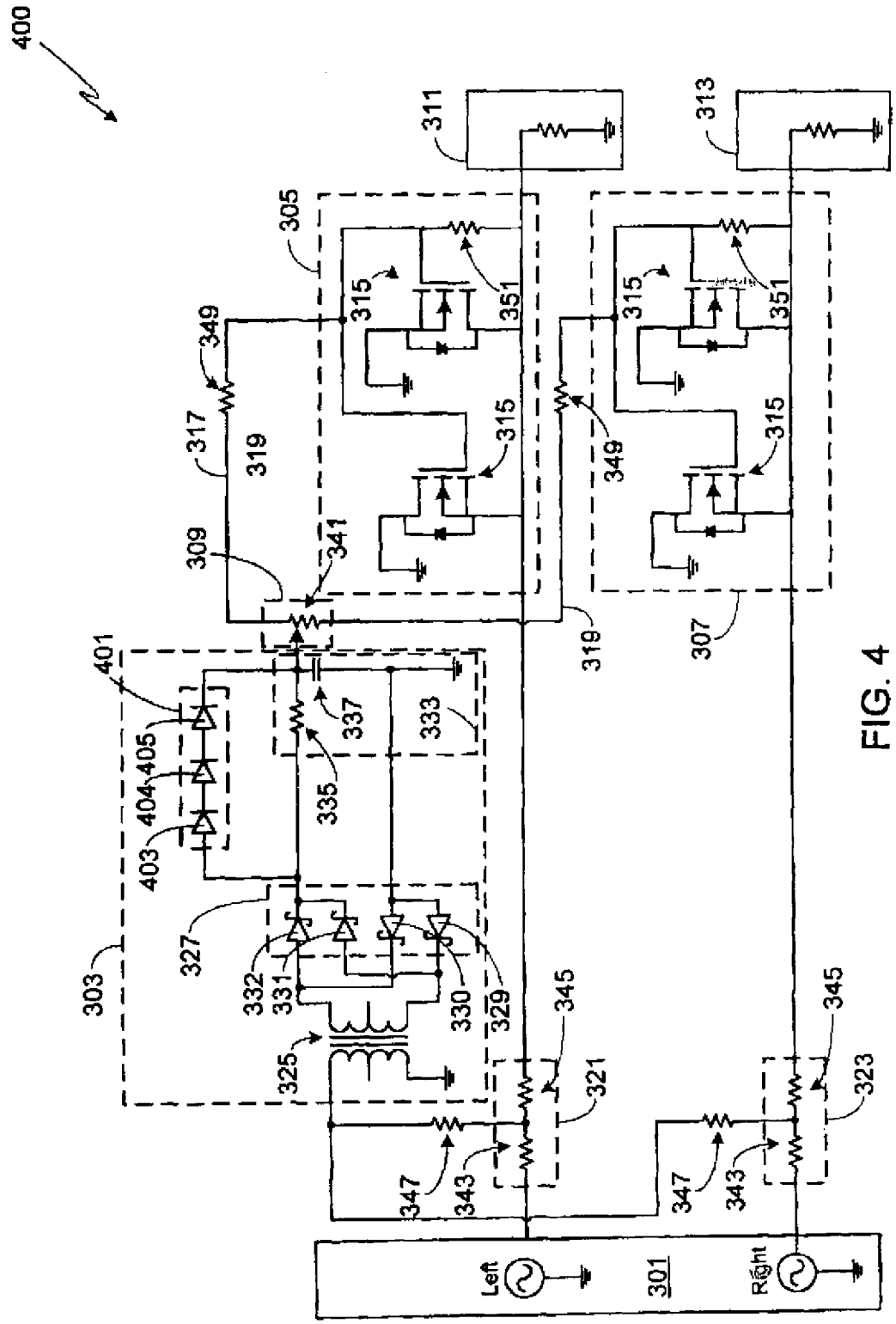
Figure 5:
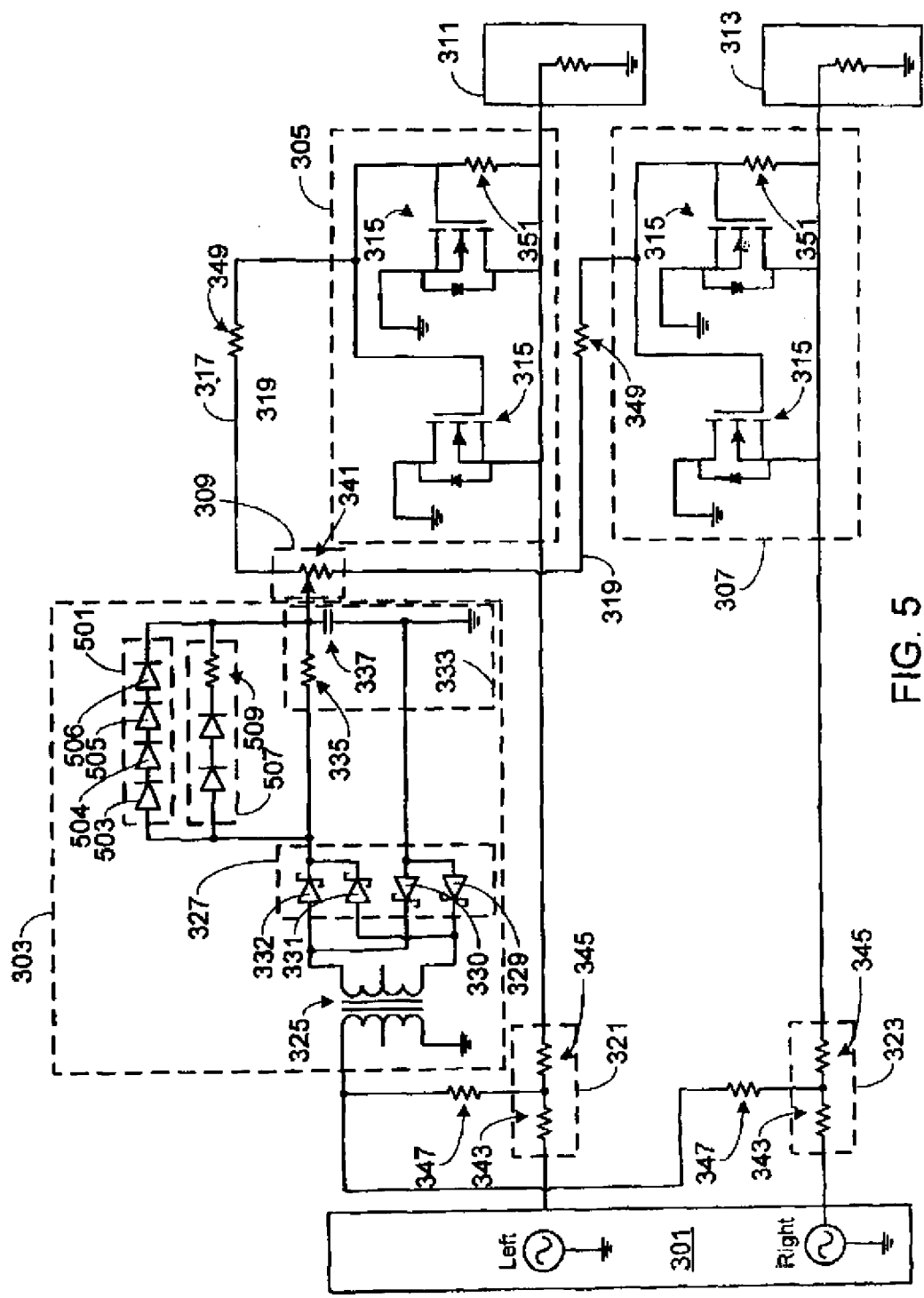
Figure 6:
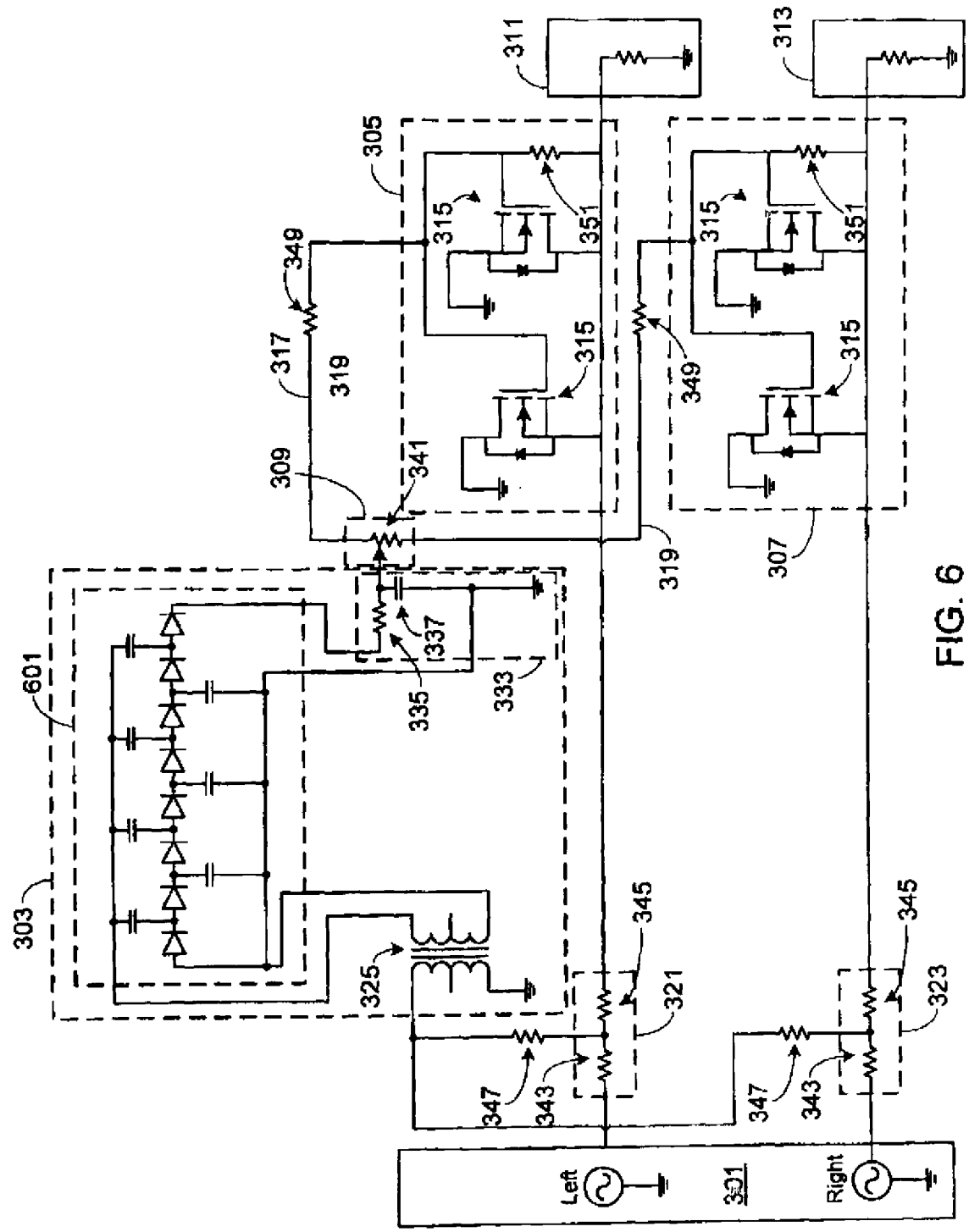
Figure 7:
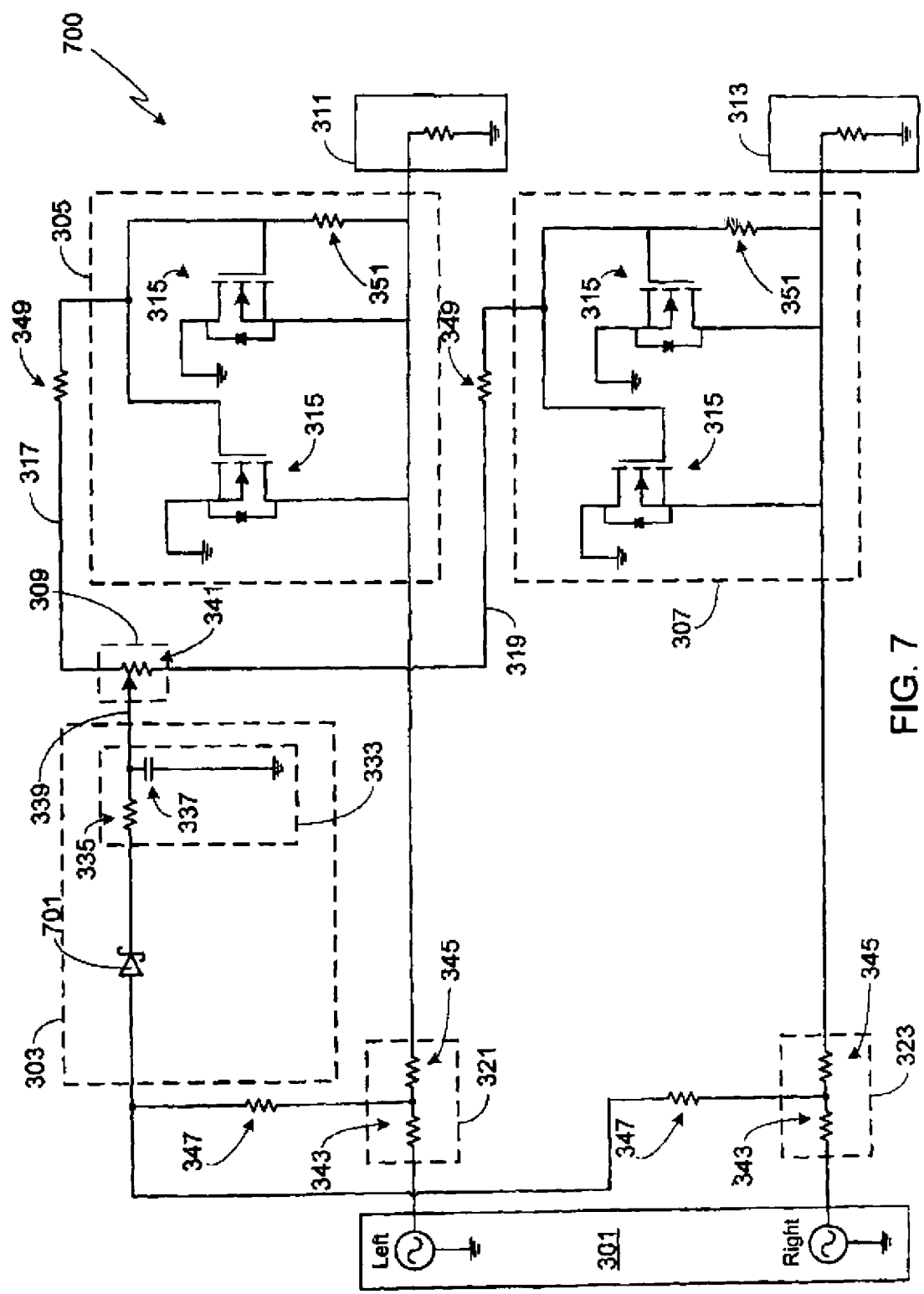
Figure 8:
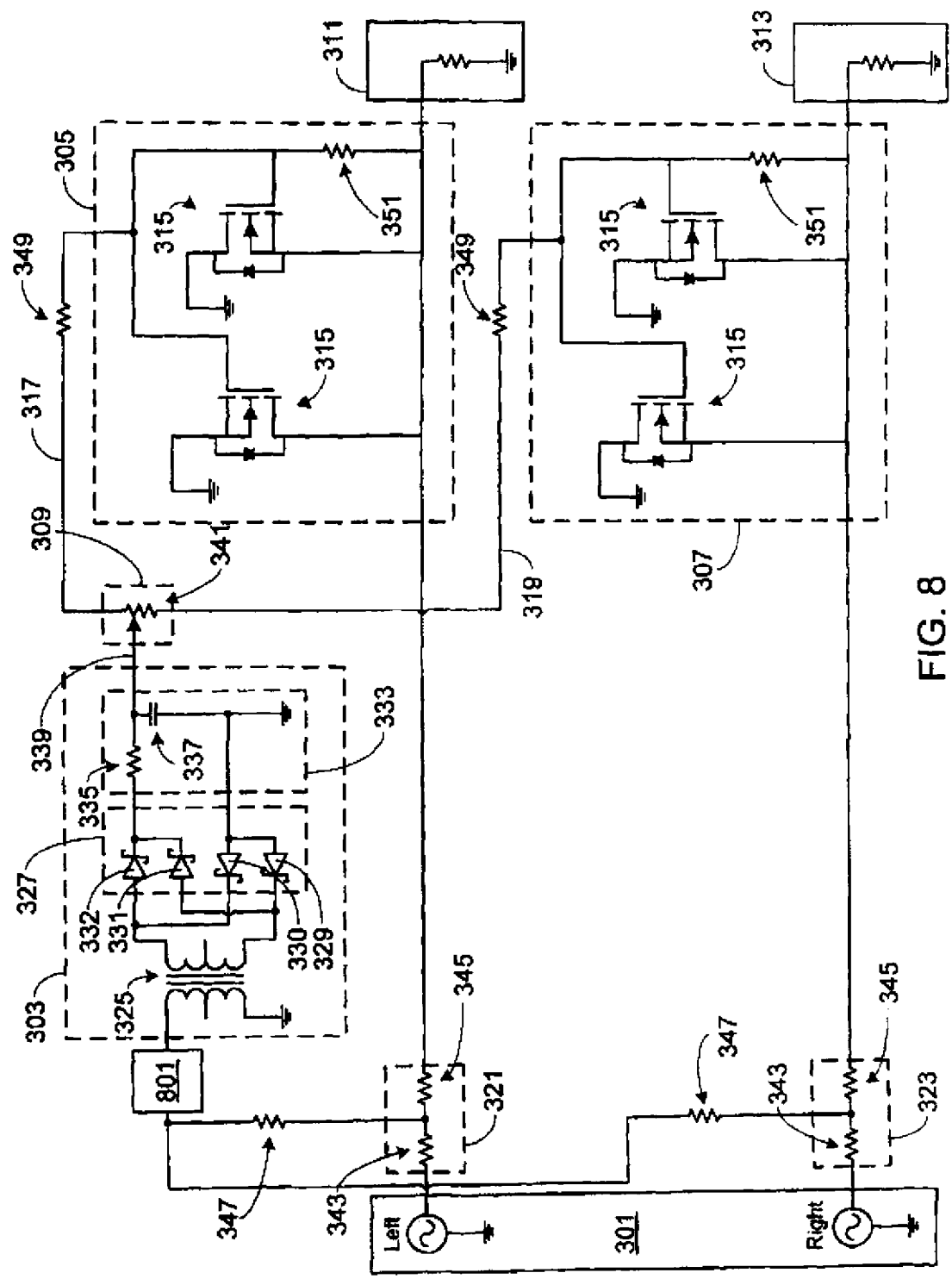
Figure 9:
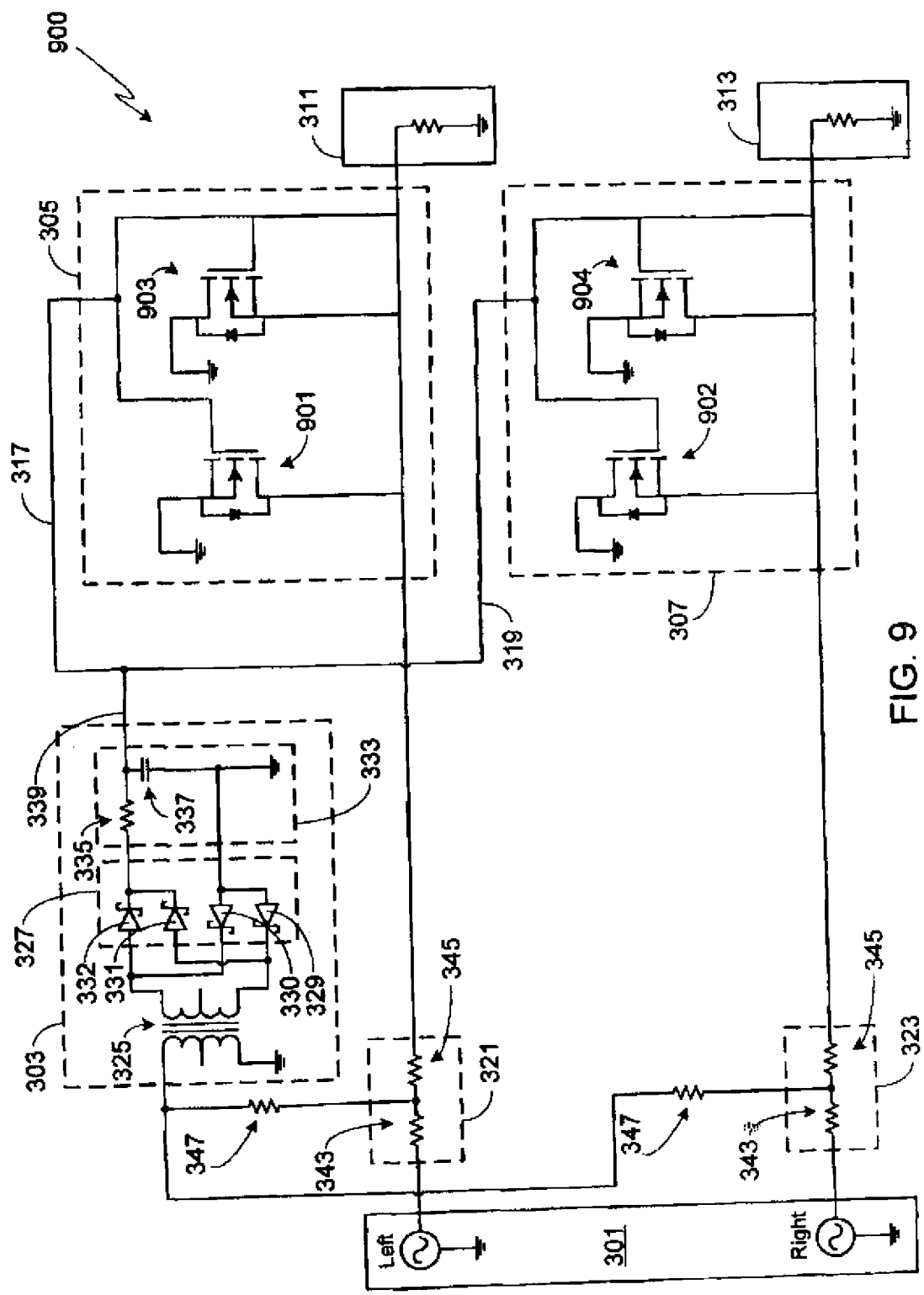
Figure 10:
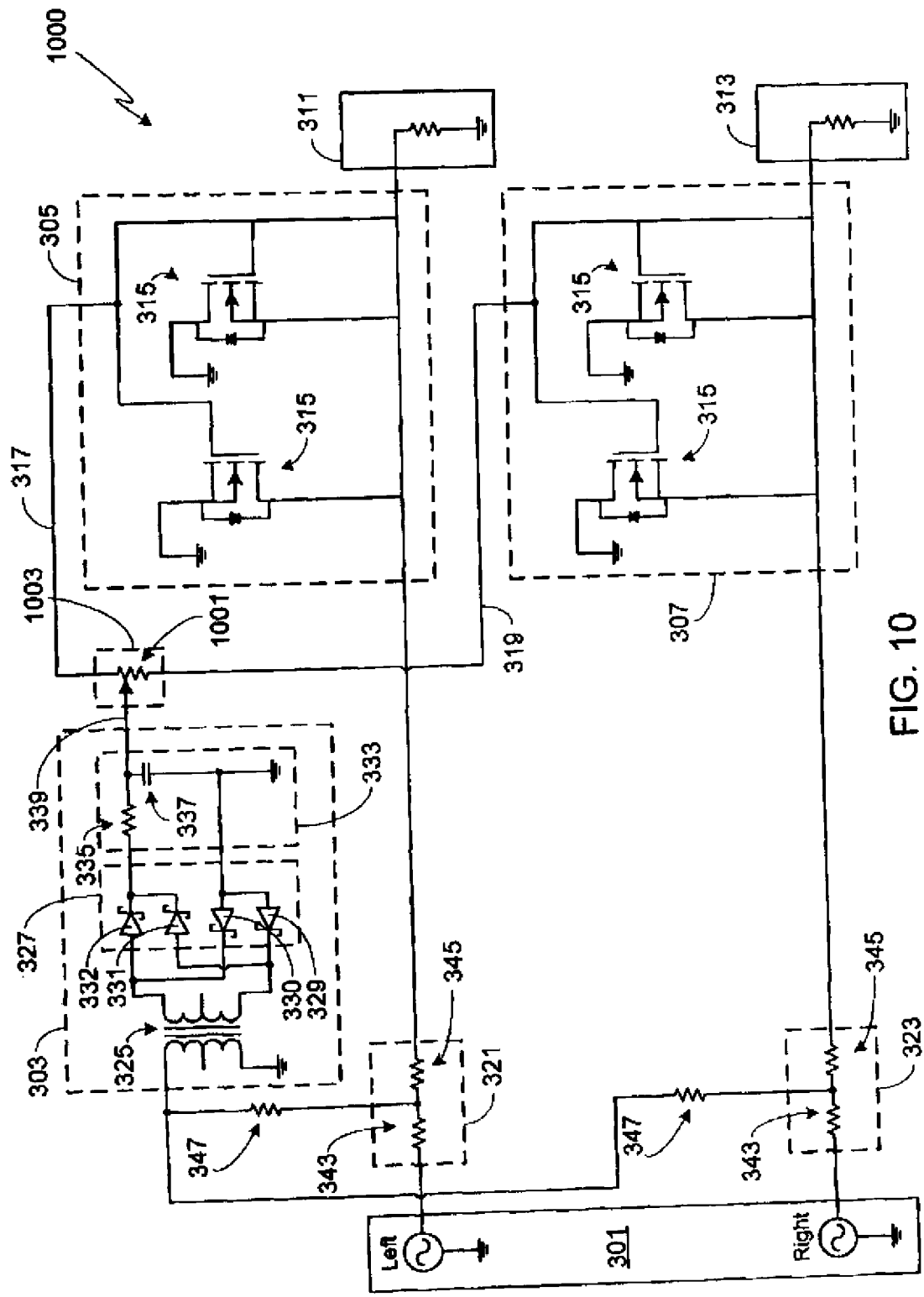

FIG. 10 illustrates another modification of the approach illustrated in FIGS. 3-8. In circuit 1000, the divider for each limiting circuit is removed, and the value of potentiometer 1001 of balancing circuit 1003 is increased, typically to a value in the range of 10's to 100's of Mohms. By using a high value potentiometer, the leakage currents on the FET gates become significant, thus allowing for different gate voltages on the FETs depending upon the position of the potentiometer. As in the prior circuits, the potentiometer may be replaced by a pair of fixed value resistors (e.g., solder selectable resistors, laser trimmed resistors, etc.).

As will be understood by those familiar with the art, the present invention may be embodied in other specific forms

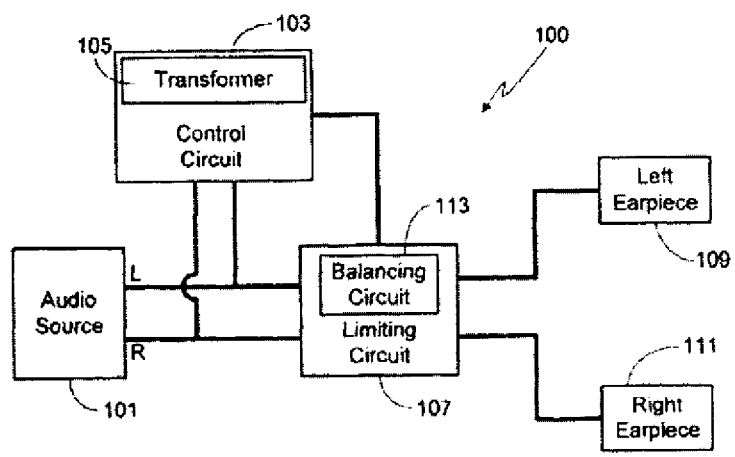

What is claimed is:

1. A passive sound pressure level (SPL) limiter coupled to an audio source, a left earpiece and a right earpiece, wherein the passive SPL limiter limits a left channel audio output signal from the audio source to the left earpiece and limits a right channel audio output signal from the audio source to the right earpiece, the passive SPL limiter comprising:
   a control circuit electrically connected to the audio source and receiving said left channel audio output signal from the audio source and said right channel audio output signal from the audio source, wherein said control circuit outputs a control signal via a control circuit output;
   a balancing circuit electrically connected to said control circuit, said balancing circuit receiving said control signal from said control circuit via said control circuit output, wherein said balancing circuit outputs a left channel control signal and a right channel control signal;
   a left channel limiting circuit electrically connected to said balancing circuit and configured to receive said left channel control signal from said balancing circuit, said left channel limiting circuit comprised of a first pair of FETs, wherein said left channel limiting circuit reduces said left channel audio output signal from the audio source to the left earpiece in proportion to said left channel control signal; and
   a right channel limiting circuit electrically connected to said balancing circuit and configured to receive said right channel control signal from said balancing circuit, said right channel limiting circuit comprised of a second pair of FETs, wherein said right channel limiting circuit reduces said right channel audio output signal from the audio source to the right earpiece in proportion to said right channel control signal.

2. The passive SPL limiter of claim 1, further comprising a microphone and an audio plug, wherein said microphone is integrated into an earpiece cable, and wherein said audio plug is electrically connected to said control circuit, said left earpiece, said right earpiece and said microphone.

3. The passive SPL limiter of claim 1, further comprising a microphone, a stereo plug, and a microphone plug, wherein said microphone is integrated into an earpiece cable, wherein said stereo plug is electrically connected to said control circuit, said left earpiece, and said right earpiece, and wherein said microphone plug is electrically connected to said microphone.

4. The passive SPL limiter of claim 1, said balancing circuit further comprising a potentiometer, wherein said balancing circuit is configured to achieve a balanced output from said left and right channel limiting circuits.

5. The passive SPL limiter of claim 1, said control circuit further comprising a transformer and a rectifier circuit, said transformer increasing the voltage corresponding to said left channel audio output signal and said right channel audio output signal, and wherein said rectifier is located on a secondary side of said transformer.

6. The passive SPL limiter of claim 5, wherein said transformer has a turns ratio of between 1:10 and 1:50.

7. The passive SPL limiter of claim 5, wherein said rectifier circuit is a full wave rectifier comprised of four Schottky diodes.

8. The passive SPL limiter of claim 5, said control circuit further comprising a filter circuit interposed between said rectifier circuit and said control circuit output.

9. The passive SPL limiter of claim 8, wherein said filter circuit is a low pass filter comprised of an RC filter.

10. The passive SPL limiter of claim 9, said control circuit further comprising a fast limit diode path in parallel with a resistor of said RC filter, wherein said fast limit diode path is comprised of at least one diode.

11. The passive SPL limiter of claim 10, said fast limit diode path further comprising a current limiting resistor in series with said at least one diode.

12. The passive SPL limiter of claim 9, said control circuit further comprising at least a first fast limit diode path with a first charge rate and a second fast limit diode path with a second charge rate, wherein said at least first and second fast limit diode paths are in parallel with a resistor of said RC filter.

13. The passive SPL limiter of claim 12, wherein at least one of said first and second fast limit diode paths are further comprised of a current limiting resistor.

14. The passive SPL limiter of claim 1, further comprising at least a first pad resistor interposed between said audio source and said left earpiece and at least a second pad resistor interposed between said audio source and said right earpiece.

15. The passive SPL limiter of claim 1, further comprising at least a first channel separation resistor and a second channel separation resistor interposed between said audio source and said control circuit, wherein said first channel separation resistor affects said left channel audio output signal and wherein said second channel separation resistor affects said right channel audio output signal.

16. The passive SPL limiter of claim 1, said left channel limiting circuit further comprising a left channel divider and said right channel limiting circuit further comprising a right channel divider.

17. The passive SPL limiter of claim 16, wherein said left channel divider is comprised of a first pair of resistors and said right channel divider is comprised of a second pair of resistors.

18. The passive SPL limiter of claim 1, said control circuit further comprising a transformer and a voltage multiplier, said transformer increasing the voltage corresponding to said left channel audio output signal and said right channel audio output signal, and wherein said voltage multiplier is located on a secondary side of said transformer.

19. The passive SPL limiter of claim 1, further comprising a frequency-weighting filter.

20. The passive SPL limiter of claim 19, wherein said frequency-weighting filter is interposed between said audio source and said control circuit.

21. A passive sound pressure level (SPL) limiter coupled to an audio source, a left earpiece and a right earpiece, wherein the passive SPL limiter limits a left channel audio output signal from the audio source to the left earpiece and limits a right channel audio output signal from the audio source to the right earpiece, the passive SPL limiter comprising:
   a control circuit electrically connected to the audio source and receiving said left channel audio output signal from the audio source and said right channel audio output signal from the audio source, wherein said control circuit outputs a control signal via a control circuit output;
   a left channel limiting circuit electrically connected to said control circuit and configured to receive said control signal from said control circuit, said left channel limiting circuit comprised of a first pair of FETs, wherein said left channel limiting circuit reduces said left channel audio output signal from the audio source to the left earpiece in proportion to said control signal; and a right channel limiting circuit electrically connected to said control circuit and configured to receive said control signal from said control circuit, said right channel limiting circuit comprised of a second pair of FETs, wherein said right channel limiting circuit reduces said right channel audio output signal from the audio source to the right earpiece in proportion to said control signal.

22. The passive SPL limiter of claim 21, wherein said first pair of FETs is comprised of a first FET and a second FET, wherein said second pair of FETs is comprised of a third FET and a fourth FET, wherein said first FET and said third FET comprise a first pair of matched FETs, and wherein said second FET and said fourth FET comprise a second pair of matched FETs.

* * * * *

UNITED STATES PATENT AND TRADEMARK OFFICE
CERTIFICATE OF CORRECTION

| | |
|---|---|
| PATENT NO. | : 8,515,084 B2 |
| APPLICATION NO. | : 13/043313 |
| DATED | : August 20, 2013 |
| INVENTOR(S) | : Barr et al. |

It is certified that error appears in the above-identified patent and that said Letters Patent is hereby corrected as shown below:

Please delete the title page and insert the title page showing an illustrative figure as attached.

In the Drawings

Please delete drawing sheets 1-10 and insert drawing sheets 1-9 with figures 1-10 as attached.

Signed and Sealed this
Fourth Day of February, 2014

Michelle K. Lee
*Deputy Director of the United States Patent and Trademark Office*

(12) United States Patent
Barr et al.

(10) Patent No.: US 8,515,084 B2
(45) Date of Patent: Aug. 20, 2013

(54) PASSIVE SOUND PRESSURE LEVEL LIMITER WITH BALANCING CIRCUIT

(75) Inventors: Joshua James Barr, Bangor, MI (US); Medford Alan Dyer, San Diego, CA (US); Alan Dean Michel, Fishers, IN (US); Christopher Todd Welsh, Fishers, IN (US)

(73) Assignee: Harman International Industries, Inc., Stamford, CT (US)

( * ) Notice: Subject to any disclaimer, the term of this patent is extended or adjusted under 35 U.S.C. 154(b) by 360 days.

(21) Appl. No.: 13/043,313

(22) Filed: Mar. 8, 2011

(65) Prior Publication Data

US 2011/0158414 A1 Jun. 30, 2011

Related U.S. Application Data

(63) Continuation-in-part of application No. 12/583,139, filed on Aug. 13, 2009, now Pat. No. 8,340,307.

(51) Int. Cl.
*H03G 11/00* (2006.01)

(52) U.S. Cl.
USPC .................. 381/55; 381/56; 381/72

(58) Field of Classification Search
USPC .......... 381/55-58, 72, 74, 71.4, 17, 150, 381/117, 346, 107, 349, 337, 163; 181/129, 181/157, 163, 175, 139
See application file for complete search history.

(56) References Cited

U.S. PATENT DOCUMENTS

| | | | |
|---|---|---|---|
| 3,869,699 A | 3/1975 | Haller et al. | |
| 5,553,151 A * | 9/1996 | Goldberg | 381/312 |
| 6,408,069 B1 | 6/2002 | Furlong | |
| 7,046,813 B1 * | 5/2006 | Denda | 381/98 |
| 7,907,736 B2 * | 3/2011 | Yuen et al. | 381/1 |
| 8,218,784 B2 * | 7/2012 | Schulein et al. | 381/74 |
| 2003/0035549 A1 * | 2/2003 | Bizjak et al. | 381/56 |
| 2006/0262938 A1 | 11/2006 | Gauger et al. | |
| 2007/0230715 A1 | 10/2007 | Ingemi et al. | |
| 2008/0175397 A1 | 7/2008 | Holman | |

OTHER PUBLICATIONS

NJRC's Audio IC Line-up, featuring the NJM2761, NJR News, vol. 44, Nov. 30, 2004, p. 1 http://www.njr.com/index4.html.

* cited by examiner

*Primary Examiner* — Vivian Chin
*Assistant Examiner* — Friedrich W Fahnert
(74) *Attorney, Agent, or Firm* — Patent Law Office of David G. Beck

(57) ABSTRACT

A passive sound pressure level (SPL) limiter is provided that can be used with audio sources of varying drive levels and headphones or earphones of varying sensitivity. The SPL limiter includes a control circuit and left and right channel limiting circuits, each of which includes a pair of FETS. The SPL limiter may include a balancing circuit that separates the control signal output by the control circuit into left and right channel control signals. The SPL limiter may also include a microphone, for example integrated into an earpiece cable.

22 Claims, 10 Drawing Sheets

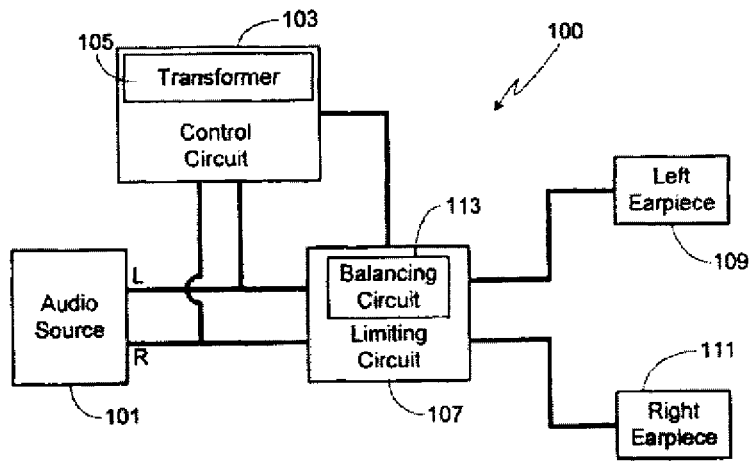

UNITED STATES PATENT AND TRADEMARK OFFICE
CERTIFICATE OF CORRECTION

PATENT NO. : 8,515,084 B2
APPLICATION NO. : 13/043313
DATED : August 20, 2013
INVENTOR(S) : Barr et al.

It is certified that error appears in the above-identified patent and that said Letters Patent is hereby corrected as shown below:

Please delete the title page and insert the title page showing an illustrative figure as attached.

In the Drawings

Please delete drawing sheets 1-10 and insert drawing sheets 1-9 with figures 1-10 as attached.

This certificate supersedes the Certificate of Correction issued February 4, 2014.

Signed and Sealed this
Eleventh Day of March, 2014

Michelle K. Lee
*Deputy Director of the United States Patent and Trademark Office*

United States Patent
Barr et al.

(10) Patent No.: US 8,515,084 B2
(45) Date of Patent: Aug. 20, 2013

(54) PASSIVE SOUND PRESSURE LEVEL LIMITER WITH BALANCING CIRCUIT

(75) Inventors: Joshua James Barr, Bangor, MI (US); Medford Alan Dyer, San Diego, CA (US); Alan Dean Michel, Fishers, IN (US); Christopher Todd Welsh, Fishers, IN (US)

(73) Assignee: Harman International Industries, Inc., Stamford, CT (US)

(*) Notice: Subject to any disclaimer, the term of this patent is extended or adjusted under 35 U.S.C. 154(b) by 360 days.

(21) Appl. No.: 13/043,313

(22) Filed: Mar. 8, 2011

(65) Prior Publication Data
US 2011/0158414 A1 Jun. 30, 2011

Related U.S. Application Data

(63) Continuation-in-part of application No. 12/583,139, filed on Aug. 13, 2009, now Pat. No. 8,340,307.

(51) Int. Cl.
*H03G 11/00* (2006.01)

(52) U.S. Cl.
USPC ............................... 381/55; 381/56; 381/72

(58) Field of Classification Search
USPC ............. 381/55–58, 72, 74, 71.4, 17, 150, 381/117, 346, 107, 349, 337, 163; 181/129, 181/157, 163, 175, 139
See application file for complete search history.

(56) References Cited

U.S. PATENT DOCUMENTS

| | | |
|---|---|---|
| 3,869,699 A | 3/1975 | Haller et al. |
| 5,553,151 A * | 9/1996 | Goldberg ............ 381/312 |
| 6,408,069 B1 | 6/2002 | Furlong |
| 7,046,813 B1 * | 5/2006 | Denda ............... 381/98 |
| 7,907,736 B2 * | 3/2011 | Yuen et al. ........... 381/1 |
| 8,218,784 B2 * | 7/2012 | Schulein et al. ...... 381/74 |
| 2003/0035549 A1 * | 2/2003 | Bizjak et al. ......... 381/56 |
| 2006/0262938 A1 | 11/2006 | Gauger et al. |
| 2007/0230715 A1 | 10/2007 | Ingemi et al. |
| 2008/0175397 A1 | 7/2008 | Holman |

OTHER PUBLICATIONS

NJRC's Audio IC Line-up, featuring the NJM2761, NJR News, vol. 44, Nov. 30, 2004, p. 1 http://www.njr.com/index4.html.

* cited by examiner

*Primary Examiner* — Vivian Chin
*Assistant Examiner* — Friedrich W Fahnert
(74) *Attorney, Agent, or Firm* — Patent Law Office of David G. Beck

(57) ABSTRACT

A passive sound pressure level (SPL) limiter is provided that can be used with audio sources of varying drive levels and headphones or earphones of varying sensitivity. The SPL limiter includes a control circuit and left and right channel limiting circuits, each of which includes a pair of FETs. The SPL limiter may include a balancing circuit that separates the control signal output by the control circuit into left and right channel control signals. The SPL limiter may also include a microphone, for example integrated into an earpiece cable.

22 Claims, 9 Drawing Sheets